US011935575B1

(12) United States Patent
Sarwar et al.

(10) Patent No.: US 11,935,575 B1
(45) Date of Patent: Mar. 19, 2024

(54) HETEROGENEOUS MEMORY SYSTEM

(71) Applicant: Meta Platforms Technologies, LLC, Menlo Park, CA (US)

(72) Inventors: Syed Shakib Sarwar, Bellevue, WA (US); Ziyun Li, Redmond, WA (US); Xinqiao Liu, Medina, WA (US); Barbara De Salvo, Belmont, CA (US)

(73) Assignee: Meta Platforms Technologies, LLC, Menlo Park, CA (US)

(*) Notice: Subject to any disclaimer, the term of this patent is extended or adjusted under 35 U.S.C. 154(b) by 102 days.

(21) Appl. No.: 17/556,436

(22) Filed: Dec. 20, 2021

Related U.S. Application Data

(60) Provisional application No. 63/130,365, filed on Dec. 23, 2020.

(51) Int. Cl.
*G11C 11/16* (2006.01)
*G06F 1/16* (2006.01)
(Continued)

(52) U.S. Cl.
CPC .......... *G11C 11/4045* (2013.01); *G06F 1/163* (2013.01); *G11C 11/16* (2013.01);
(Continued)

(58) Field of Classification Search
CPC ....... G11C 11/16; G11C 11/54; G11C 11/412; G11C 11/4045; G11C 11/4091; G11C 11/4096; G06F 1/163; H03K 19/01742
See application file for complete search history.

(56) References Cited

U.S. PATENT DOCUMENTS 6,384,905 B1   5/2002   Barrows
6,853,579 B1 *   2/2005   Chou .................... G11C 11/412
                                              365/191
(Continued)

FOREIGN PATENT DOCUMENTS

CN     103207716 A     7/2013
CN     104204904 A     12/2014
(Continued)

OTHER PUBLICATIONS

Amir et al."NeuroSensor: A 3D Image Sensor with Integrated Neural Accelerator," Oct. 10-13, 2016, 2-16 IEEE SOI-3D Sub-threshold Microelectronics Technology Unified Conference (S3S), pp. 1-2 (Year: 2016) (Year: 2016).*
(Continued)

*Primary Examiner* — Amare Mengistu
*Assistant Examiner* — Jennifer L Zubajlo
(74) *Attorney, Agent, or Firm* — Kilpatrick Townsend & Stockton LLP

(57) ABSTRACT

An example apparatus having a heterogenous memory system includes a first sensor layer, of a plurality of stacked sensor layers, including an array of pixels; and one or more semiconductor layers of the plurality of stacked sensor layers located beneath the first sensor layer, the one or more semiconductor layers configured to process pixel data output by the array of pixels, the one or more semiconductor layers including a first memory to store most significant bits ("MSBs") of data involved in the processing of the pixel data; a second memory to store least significant bits ("LSBs") of the data; and wherein the first memory has a lower bit error rate ("BER") than the second memory.

20 Claims, 16 Drawing Sheets

(51) Int. Cl.
  *G11C 11/404* (2006.01)
  *G11C 11/412* (2006.01)
  *G11C 11/54* (2006.01)
  *H03K 19/017* (2006.01)
  *G11C 11/4091* (2006.01)
  *G11C 11/4096* (2006.01)

(52) U.S. Cl.
  CPC ............ *G11C 11/412* (2013.01); *G11C 11/54* (2013.01); *H03K 19/01742* (2013.01); *G11C 11/4091* (2013.01); *G11C 11/4096* (2013.01)

(56) References Cited

U.S. PATENT DOCUMENTS

| | | | |
|---|---|---|---|
| 7,359,275 B1 * | 4/2008 | Wu | G11C 11/413 |
| | | | 365/154 |
| 7,659,925 B2 | 2/2010 | Krymski | |
| 7,920,409 B1 * | 4/2011 | Clark | G11C 11/412 |
| | | | 365/189.16 |
| 7,956,914 B2 | 6/2011 | Xu | |
| 7,969,759 B1 * | 6/2011 | Thummalapally | G11C 8/08 |
| | | | 365/189.05 |
| 8,134,623 B2 | 3/2012 | Purcell et al. | |
| 8,779,346 B2 | 7/2014 | Fowler et al. | |
| 9,094,629 B2 | 7/2015 | Ishibashi | |
| 9,282,264 B2 | 3/2016 | Park et al. | |
| 9,363,454 B2 | 6/2016 | Ito et al. | |
| 9,646,681 B1 * | 5/2017 | Jung | G11C 11/412 |
| 9,832,370 B2 | 11/2017 | Cho et al. | |
| 9,955,091 B1 | 4/2018 | Dai et al. | |
| 10,090,342 B1 | 10/2018 | Gambino et al. | |
| 10,096,631 B2 | 10/2018 | Ishizu | |
| 10,154,221 B2 | 12/2018 | Ogino et al. | |
| 10,157,951 B2 | 12/2018 | Kim et al. | |
| 10,321,081 B2 | 6/2019 | Watanabe et al. | |
| 10,345,447 B1 | 7/2019 | Hicks | |
| 10,594,974 B2 | 3/2020 | Ivarsson et al. | |
| 10,726,627 B2 | 7/2020 | Liu | |
| 10,867,655 B1 * | 12/2020 | Harms | G11C 11/2273 |
| 10,897,586 B2 | 1/2021 | Liu et al. | |
| 11,057,581 B2 * | 7/2021 | Liu | H04N 25/40 |
| 11,126,497 B2 * | 9/2021 | Oh | G06F 11/1044 |
| 11,204,835 B2 * | 12/2021 | Lu | G06F 11/106 |
| 11,568,609 B1 * | 1/2023 | Liu | G06N 3/065 |
| 11,630,724 B2 * | 4/2023 | Shin | G06F 3/0673 |
| | | | 714/764 |
| 2002/0113886 A1 | 8/2002 | Hynecek | |
| 2003/0020100 A1 | 1/2003 | Guidash | |
| 2005/0057389 A1 | 3/2005 | Krymski | |
| 2005/0073874 A1 * | 4/2005 | Chan | G11C 11/412 |
| | | | 365/154 |
| 2005/0237380 A1 | 10/2005 | Kakii et al. | |
| 2007/0076109 A1 | 4/2007 | Krymski | |
| 2007/0222881 A1 | 9/2007 | Mentzer | |
| 2008/0007731 A1 | 1/2008 | Botchway et al. | |
| 2008/0226170 A1 | 9/2008 | Sonoda | |
| 2009/0033588 A1 | 2/2009 | Kajita et al. | |
| 2009/0245637 A1 | 10/2009 | Barman et al. | |
| 2010/0194956 A1 | 8/2010 | Yuan et al. | |
| 2010/0276572 A1 | 11/2010 | Iwabuchi et al. | |
| 2011/0055461 A1 * | 3/2011 | Steiner | G11C 11/5628 |
| | | | 711/E12.008 |
| 2011/0075470 A1 * | 3/2011 | Liaw | H10B 10/00 |
| | | | 365/189.05 |
| 2011/0155892 A1 | 6/2011 | Neter et al. | |
| 2011/0254986 A1 | 10/2011 | Nishimura et al. | |
| 2012/0002459 A1 * | 1/2012 | Rimondi | G11C 11/419 |
| | | | 365/154 |
| 2012/0002460 A1 * | 1/2012 | Rimondi | H10B 10/00 |
| | | | 365/156 |
| 2012/0086082 A1 * | 4/2012 | Malinge | G11C 11/412 |
| | | | 257/E21.532 |
| 2012/0105475 A1 | 5/2012 | Tseng | |
| 2012/0105668 A1 | 5/2012 | Velarde et al. | |
| 2012/0113119 A1 | 5/2012 | Massie | |
| 2012/0133807 A1 | 5/2012 | Wu et al. | |
| 2012/0198312 A1 * | 8/2012 | Kankani | G06F 11/102 |
| | | | 714/768 |
| 2012/0200499 A1 | 8/2012 | Osterhout et al. | |
| 2012/0212465 A1 | 8/2012 | White et al. | |
| 2012/0240007 A1 * | 9/2012 | Barndt | H03M 13/3707 |
| | | | 714/E11.03 |
| 2012/0262616 A1 | 10/2012 | Sa et al. | |
| 2013/0056809 A1 | 3/2013 | Mao et al. | |
| 2013/0057742 A1 | 3/2013 | Nakamura et al. | |
| 2013/0068929 A1 | 3/2013 | Solhusvik et al. | |
| 2013/0069787 A1 | 3/2013 | Petrou | |
| 2013/0141619 A1 | 6/2013 | Lim et al. | |
| 2013/0185609 A1 * | 7/2013 | Park | G06F 11/0751 |
| | | | 714/E11.023 |
| 2013/0187027 A1 | 7/2013 | Qiao et al. | |
| 2013/0198577 A1 * | 8/2013 | Oh | H03M 13/05 |
| | | | 714/704 |
| 2013/0207219 A1 | 8/2013 | Ahn | |
| 2013/0299674 A1 | 11/2013 | Fowler et al. | |
| 2013/0326116 A1 * | 12/2013 | Goss | G06F 12/0871 |
| | | | 711/144 |
| 2014/0042299 A1 | 2/2014 | Wan et al. | |
| 2014/0247382 A1 | 9/2014 | Moldovan et al. | |
| 2014/0368687 A1 | 12/2014 | Yu et al. | |
| 2015/0085134 A1 | 3/2015 | Novotny et al. | |
| 2015/0189209 A1 | 7/2015 | Yang et al. | |
| 2015/0201142 A1 | 7/2015 | Smith et al. | |
| 2015/0229859 A1 | 8/2015 | Guidash et al. | |
| 2015/0279884 A1 | 10/2015 | Kusumoto | |
| 2015/0309311 A1 | 10/2015 | Cho | |
| 2015/0309316 A1 | 10/2015 | Osterhout et al. | |
| 2015/0312502 A1 | 10/2015 | Borremans | |
| 2015/0358571 A1 | 12/2015 | Dominguez Castro et al. | |
| 2015/0381911 A1 | 12/2015 | Shen et al. | |
| 2016/0011422 A1 | 1/2016 | Thurber et al. | |
| 2016/0018645 A1 | 1/2016 | Haddick et al. | |
| 2016/0021302 A1 | 1/2016 | Cho et al. | |
| 2016/0028974 A1 | 1/2016 | Guidash et al. | |
| 2016/0078614 A1 | 3/2016 | Ryu et al. | |
| 2016/0088253 A1 | 3/2016 | Tezuka | |
| 2016/0100115 A1 | 4/2016 | Kusano | |
| 2016/0165160 A1 | 6/2016 | Hseih et al. | |
| 2016/0210785 A1 | 7/2016 | Balachandreswaran et al. | |
| 2016/0360127 A1 | 12/2016 | Dierickx et al. | |
| 2017/0039906 A1 | 2/2017 | Jepsen | |
| 2017/0041571 A1 | 2/2017 | Tyrrell et al. | |
| 2017/0154909 A1 | 6/2017 | Ishizu | |
| 2017/0228345 A1 | 8/2017 | Gupta et al. | |
| 2017/0270664 A1 | 9/2017 | Hoogi et al. | |
| 2017/0272768 A1 | 9/2017 | Tall et al. | |
| 2017/0280031 A1 | 9/2017 | Price et al. | |
| 2017/0293799 A1 | 10/2017 | Skogo et al. | |
| 2017/0310910 A1 | 10/2017 | Smith et al. | |
| 2017/0338262 A1 | 11/2017 | Hirata | |
| 2017/0339327 A1 | 11/2017 | Koshkin et al. | |
| 2018/0115725 A1 | 4/2018 | Zhang et al. | |
| 2018/0136471 A1 | 5/2018 | Miller et al. | |
| 2018/0143701 A1 | 5/2018 | Suh et al. | |
| 2018/0167575 A1 | 6/2018 | Watanabe et al. | |
| 2018/0176545 A1 | 6/2018 | Aflaki Beni | |
| 2018/0204867 A1 | 7/2018 | Kim et al. | |
| 2018/0224658 A1 | 8/2018 | Teller | |
| 2018/0241953 A1 | 8/2018 | Johnson | |
| 2018/0270436 A1 | 9/2018 | Ivarsson et al. | |
| 2018/0276841 A1 | 9/2018 | Krishnaswamy et al. | |
| 2019/0035154 A1 * | 1/2019 | Liu | G06V 20/64 |
| 2019/0046044 A1 | 2/2019 | Tzvieli et al. | |
| 2019/0098232 A1 | 3/2019 | Mori et al. | |
| 2019/0110039 A1 | 4/2019 | Linde et al. | |
| 2019/0123088 A1 | 4/2019 | Kwon | |
| 2019/0149751 A1 | 5/2019 | Wise | |
| 2019/0172227 A1 | 6/2019 | Kasahara | |
| 2019/0191116 A1 | 6/2019 | Madurawe | |
| 2019/0246036 A1 | 8/2019 | Wu et al. | |
| 2019/0253650 A1 | 8/2019 | Kim | |
| 2019/0331914 A1 | 10/2019 | Lee et al. | |
| 2019/0363118 A1 | 11/2019 | Berkovich et al. | |

(56) References Cited

U.S. PATENT DOCUMENTS

| | | | |
|---|---|---|---|
| 2020/0053299 | A1 | 2/2020 | Zhang et al. |
| 2020/0195828 | A1 | 6/2020 | Reyserhove et al. |
| 2020/0195875 | A1 | 6/2020 | Berkovich et al. |
| 2021/0026796 | A1 | 1/2021 | Graif et al. |
| 2021/0185264 | A1 | 6/2021 | Wong et al. |
| 2021/0227159 | A1 | 7/2021 | Sambonsugi |
| 2021/0264679 | A1* | 8/2021 | Liu .................. G06T 7/73 |
| 2021/0368124 | A1 | 11/2021 | Berkovich et al. |
| 2021/0409625 | A1 | 12/2021 | Zhu et al. |
| 2022/0021833 | A1 | 1/2022 | Berkovich |
| 2022/0076726 | A1* | 3/2022 | Hulton .............. G06F 11/073 |

FOREIGN PATENT DOCUMENTS

| | | | |
|---|---|---|---|
| CN | 106255978 | A | 12/2016 |
| CN | 106791504 | A | 5/2017 |
| CN | ZL201810821296 | | 6/2022 |
| EP | 1746820 | A1 | 1/2007 |
| EP | 1788802 | A1 | 5/2007 |
| EP | 2037505 | A1 | 3/2009 |
| EP | 2804074 | A2 | 11/2014 |
| EP | 3229457 | A1 | 10/2017 |
| JP | 2003319262 | A | 11/2003 |
| WO | WO-2014055391 | A2 | 4/2014 |
| WO | WO-2016095057 | A1 | 6/2016 |
| WO | WO-2017003477 | A1 | 1/2017 |
| WO | WO-2017013806 | A1 | 1/2017 |
| WO | WO-2017047010 | A1 | 3/2017 |
| WO | WO-2019018084 | A1 | 1/2019 |
| WO | WO-2019111528 | A1 | 6/2019 |
| WO | WO-2019145578 | A1 | 8/2019 |
| WO | WO-2020077283 | A1 * | 4/2020 .......... G06F 11/1044 |

OTHER PUBLICATIONS

Advisory Action dated Oct. 1, 2021 for U.S. Appl. No. 17/083,920, filed Oct. 29, 2020, 4 pages.

Amir M.F., et al., "3-D Stacked Image Sensor With Deep Neural Network Computation," IEEE Sensors Journal, IEEE Service Center, New York, NY, US, May 15, 2018, vol. 18 (10), pp. 4187-4199, XP011681876.

Cho K., et al., "A Low Power Dual CDS for a Column-Parallel CMOS Image Sensor," Journal of Semiconductor Technology and Science, Dec. 30, 2012, vol. 12 (4), pp. 388-396.

Chuxi L., et al., "A Memristor-Based Processing-in-Memory Architechture for Deep Convolutional Neural Networks Approximate Computation," Journal of Computer Research and Development, Jun. 30, 2017, vol. 54 (6), pp. 1367-1380.

Corrected Notice of Allowability dated Apr. 9, 2021 for U.S. Appl. No. 16/255,528, filed Jan. 23, 2019, 5 Pages.

Corrected Notice of Allowance dated Mar. 22, 2022 for U.S. Appl. No. 16/716,050, filed Dec. 16, 2019, 2 Pages.

Extended European Search Report for European Application No. 18179846.3, dated Dec. 7, 2018, 10 Pages.

Extended European Search Report for European Application No. 18179851.3, dated Dec. 7, 2018, 8 Pages.

Extended European Search Report for European Application No. 19743908.6, dated Sep. 30, 2020, 9 Pages.

Final Office Action dated Oct. 18, 2021 for U.S. Appl. No. 16/716,050, filed Dec. 16, 2019, 18 Pages.

Final Office Action dated Oct. 21, 2021 for U.S. Appl. No. 16/421,441, filed May 23, 2019, 23 Pages.

Final Office Action dated Jan. 27, 2021 for U.S. Appl. No. 16/255,528, filed Jan. 23, 2019, 31 Pages.

Final Office Action dated Jul. 28, 2021 for U.S. Appl. No. 17/083,920, filed Oct. 29, 2020, 19 Pages.

International Preliminary Report on Patentability for International Application No. PCT/US2020/044807, dated Feb. 17, 2022, 10 pages.

International Search Report and Written Opinion for International Application No. PCT/US2018/039350, dated Nov. 15, 2018, 11 Pages.

International Search Report and Written Opinion for International Application No. PCT/US2018/039352, dated Oct. 26, 2018, 8 Pages.

International Search Report and Written Opinion for International Application No. PCT/US2018/039431, dated Nov. 7, 2018, 12 Pages.

International Search Report and Written Opinion for International Application No. PCT/US2019/034007, dated Oct. 28, 2019, 18 Pages.

International Search Report and Written Opinion for International Application No. PCT/US2019/066805, dated Mar. 6, 2020, 9 Pages.

International Search Report and Written Opinion for International Application No. PCT/US2019/066831, dated Feb. 27, 2020, 11 Pages.

International Search Report and Written Opinion for International Application No. PCT/US2020/044807, dated Sep. 30, 2020, 12 Pages.

International Search Report and Written Opinion for International Application No. PCT/US2020/058097, dated Feb. 12, 2021, 09 Pages.

International Search Report and Written Opinion for International Application No. PCT/US2020/059636, dated Feb. 11, 2021, 18 Pages.

International Search Report and Written Opinion for International Application No. PCT/US2021/031201, dated Aug. 2, 2021, 13 Pages.

International Search Report and Written Opinion for International Application No. PCT/US2021/033321, dated Sep. 6, 2021, 11 pages.

Invitation to Pay Additional Fees and Where Applicable, Protest Fee for International Application No. PCT/US2021/041775, dated Oct. 8, 2021, 12 pages.

Millet L., et al., "A 5500-Frames/s 85-GOPS/W 3-D Stacked BSI Vision Chip Based on Parallel In-Focal-Plane Acquisition and Processing," IEEE Journal of Solid-State Circuits, USA, Apr. 1, 2019, vol. 54 (4), pp. 1096-1105, XP011716786.

Non-Final Office Action dated Jan. 1, 2021 for U.S. Appl. No. 16/715,792, filed Dec. 16, 2019, 15 Pages.

Non-Final Office Action dated Mar. 2, 2022 for U.S. Appl. No. 17/127,670, filed Dec. 18, 2020, 18 pages.

Non-Final Office Action dated Sep. 2, 2021 for U.S. Appl. No. 16/910,844, filed Jun. 24, 2020, 7 Pages.

Non-Final Office Action dated May 7, 2021 for U.S. Appl. No. 16/421,441, filed May 23, 2019, 17 Pages.

Non-Final Office Action dated Jul. 10, 2020 for U.S. Appl. No. 16/255,528, filed Jan. 23, 2019, 27 Pages.

Non-Final Office Action dated May 14, 2021 for U.S. Appl. No. 16/716,050, filed Dec. 16, 2019, 16 Pages.

Non-Final Office Action dated Apr. 21, 2021 for U.S. Appl. No. 17/083,920, filed Oct. 29, 2020, 17 Pages.

Non-Final Office Action dated Oct. 21, 2021 for U.S. Appl. No. 17/083,920, filed Oct. 29, 2020, 19 Pages.

Non-Final Office Action dated Nov. 23, 2018 for U.S. Appl. No. 15/847,517, filed Dec. 19, 2017, 21 Pages.

Non-Final Office Action dated Jul. 25, 2019 for U.S. Appl. No. 15/909,162, filed Mar. 1, 2018, 20 Pages.

Notice of Allowance dated Apr. 1, 2021 for U.S. Appl. No. 16/255,528, filed Jan. 23, 2019, 7 Pages.

Notice of Allowance dated Feb. 7, 2022 for U.S. Appl. No. 17/324,803, filed May 19, 2021, 8 pages.

Notice of Allowance dated Mar. 7, 2022 for U.S. Appl. No. 16/421,441, filed May 23, 2019, 18 pages.

Notice of Allowance dated Mar. 11, 2022 for U.S. Appl. No. 16/716,050, filed Dec. 16, 2019, 13 pages.

Notice of Allowance dated Feb. 14, 2022 for U.S. Appl. No. 16/715,792, filed Dec. 16, 2019, 9 pages.

Notice of Allowance dated Apr. 16, 2021 for U.S. Appl. No. 16/715,792, filed Dec. 16, 2019, 10 Pages.

Notice of Allowance dated Jun. 17, 2022 for U.S. Appl. No. 16/715,792, filed Dec. 16, 2019, 2 pages.

(56) References Cited

OTHER PUBLICATIONS

Notice of Allowance dated Mar. 18, 2020 for U.S. Appl. No. 15/909,162, filed Mar. 1, 2018, 9 Pages.
Notice of Allowance dated Jun. 2, 2022 for U.S. Appl. No. 16/716,050, filed Dec. 16, 2019, 13 pages.
Notice of Allowance dated Apr. 20, 2022 for U.S. Appl. No. 17/083,920, filed Oct. 29, 2020, 06 pages.
Notice of Allowance dated Dec. 22, 2021 for U.S. Appl. No. 16/910,844, filed Jun. 24, 2020, 7 pages.
Notice of Allowance dated Feb. 22, 2022 for U.S. Appl. No. 17/083,920, filed Oct. 29, 2020, 10 pages.
Notice of Allowance dated May 23, 2022 for U.S. Appl. No. 17/324,803, filed May 19, 2021, 9 pages.
Notice of Allowance dated Jun. 24, 2022 for U.S. Appl. No. 16/421,441, filed May 23, 2019, 17 pages.
Notice of Allowance dated May 24, 2022 for U.S. Appl. No. 16/715,792, filed Dec. 16, 2019, 9 pages.
Notice of Allowance dated Nov. 24, 2021 for U.S. Appl. No. 16/910,844, filed Jun. 24, 2020, 8 pages.
Notice of Allowance dated Aug. 25, 2021 for U.S. Appl. No. 16/715,792, filed Dec. 16, 2019, 9 Pages.
Notice of Allowance dated Jun. 3, 2022 for U.S. Appl. No. 17/324,803, filed May 19, 2021, 6 pages.
Office Action dated Jul. 3, 2020 for Chinese Application No. 201810821296, filed Jul. 24, 2018, 17 Pages.
Office Action dated Mar. 9, 2021 for Chinese Application No. 201810821296, filed Jul. 24, 2018, 10 Pages.
Office Action dated Jun. 28, 2020 for Chinese Application No. 201810821296, filed Jul. 24, 2018, 2 Pages.
Office Action dated Apr. 5, 2022 for European Patent Application No. 19731047.7, filed May 24, 2019, 7 pages.
Partial European Search Report for European Application No. 18179838.0, dated Dec. 5, 2018, 13 Pages.
Restriction Requirement dated Feb. 2, 2021 for U.S. Appl. No. 16/716,050, filed Dec. 16, 2019, 7 Pages.
Sebastian A., et al., "Memory Devices and Applications for In-memory Computing," Nature Nanotechnology, Nature Publication Group, Inc, London, Mar. 30, 2020, vol. 15 (7), pp. 529-544, XP037194929.
Shi C., et al., "A 1000fps Vision Chip Based on a Dynamically Reconfigurable Hybrid Architecture Comprising a PE Array and Self-Organizing Map Neural Network," International Solid-State Circuits Conference, Session 7, Image Sensors, Feb. 10, 2014, pp. 128-130, XP055826878.
Office Action dated Aug. 11, 2022 for European Patent Application No. 19731047.7, filed May 24, 2019, 10 pages.

\* cited by examiner

HETEROGENEOUS MEMORY SYSTEM

CROSS-REFERENCE TO RELATED APPLICATIONS

This application claims priority to U.S. Provisional Patent Application No. 63/130,365, titled "Heterogeneous Memory System," filed Dec. 23, 2020, the entirety of which is incorporated herein by reference.

FIELD

The present disclosure generally relates to memory system, and specifically relates to implementation of a heterogeneous memory system that can be part of an artificial reality system.

BACKGROUND

Artificial reality systems such as head-mounted display (HMD) systems employ complex sensor devices (cameras) for capturing features of objects in a surrounding area in order to provide satisfactory user experience. A limited number of conventional sensor devices can be implemented in a HMD system and utilized for, e.g., eye tracking, hand tracking, body tracking, scanning of a surrounding area with a wide field-of-view, etc. Most of the time, the conventional sensor devices capture a large amount of information from the surrounding area. Due to processing a large amount of data, the conventional sensor devices can be easily saturated negatively affecting processing speed. Furthermore, the conventional sensor devices employed in artificial reality systems dissipate a large amount of power while having a prohibitively large latency due to performing computationally intensive operations.

SUMMARY

A sensor assembly for determining one or more features of a local area surrounding some or all of the sensor assembly is presented herein. The sensor assembly includes a plurality of stacked sensor layers, i.e., sensor layers stacked on top of each other. A first sensor layer of the plurality of stacked sensor layers located on top of the sensor assembly can be implemented as a photodetector layer and includes an array of pixels. The top sensor layer can be configured to capture one or more images of light reflected from one or more objects in the local area. The sensor assembly further includes one or more sensor layers located beneath the photodetector layer. The one or more sensor layers can be configured to process data related to the captured one or more images for determining the one or more features of the local area, e.g., depth information for the one or more objects, an image classifier, etc.

The sensor assembly further includes a heterogeneous memory system to support the image processing operation. The heterogeneous memory system can include at least two memory systems to store a numerical value. The first memory system is configured to store the higher-order or most significant bits (MSBs) of the numerical value, whereas the second memory system is configured to store the lower-order/least significant bits (LSBs) of the numerical value. The first memory system and the second memory system can be implemented using, for example, static random access memory (SRAM), magnetoresistive random access memory (MRAM), resistive RAM (RRAM), etc. The second memory system can be configured to have a higher bit error rate than the first memory system based on, for example, having reduced read/write voltages, reduced transistor sizes, etc. In a case where the memory systems are implemented using MRAM, the second memory system can have shorter wordline pulse width for write. Moreover, for read dominant application, the read current for the sense amplifier can be optimized/reduced as well. For example, the sense amplifiers for MSBs can operate with a high read current to reduce read error rate, whereas the sense amplifiers for LSBs can operate with a low read current.

A head-mounted display (HMD) can further integrate a plurality of sensor assemblies. The HMD displays content to a user wearing the HMD. The HMD may be part of an artificial reality system. The HMD further incudes an electronic display, at least one illumination source and an optical assembly. The electronic display is configured to emit image light. The at least one illumination source is configured to illuminate the local area with light captured by at least one sensor assembly of the plurality of sensor assemblies. The optical assembly is configured to direct the image light to an eye box of the HMD corresponding to a location of a user's eye. The image light may comprise depth information for the local area determined by the at least one sensor assembly based in part on the processed data related to the captured one or more images. The at least one sensor assembly further includes a heterogeneous memory system to support the image processing operation as described above.

These illustrative examples are mentioned not to limit or define the scope of this disclosure, but rather to provide examples to aid understanding thereof. Illustrative examples are discussed in the Detailed Description, which provides further description. Advantages offered by various examples may be further understood by examining this specification.

BRIEF DESCRIPTION OF THE DRAWINGS

The accompanying drawings, which are incorporated into and constitute a part of this specification, illustrate one or more certain examples and, together with the description of the example, serve to explain the principles and implementations of the certain examples. One skilled in the art will readily recognize from the following description that alternative examples of the structures and methods illustrated herein may be employed without departing from the principles, or benefits touted, of the disclosure described herein.

DETAILED DESCRIPTION

Figure 1A:
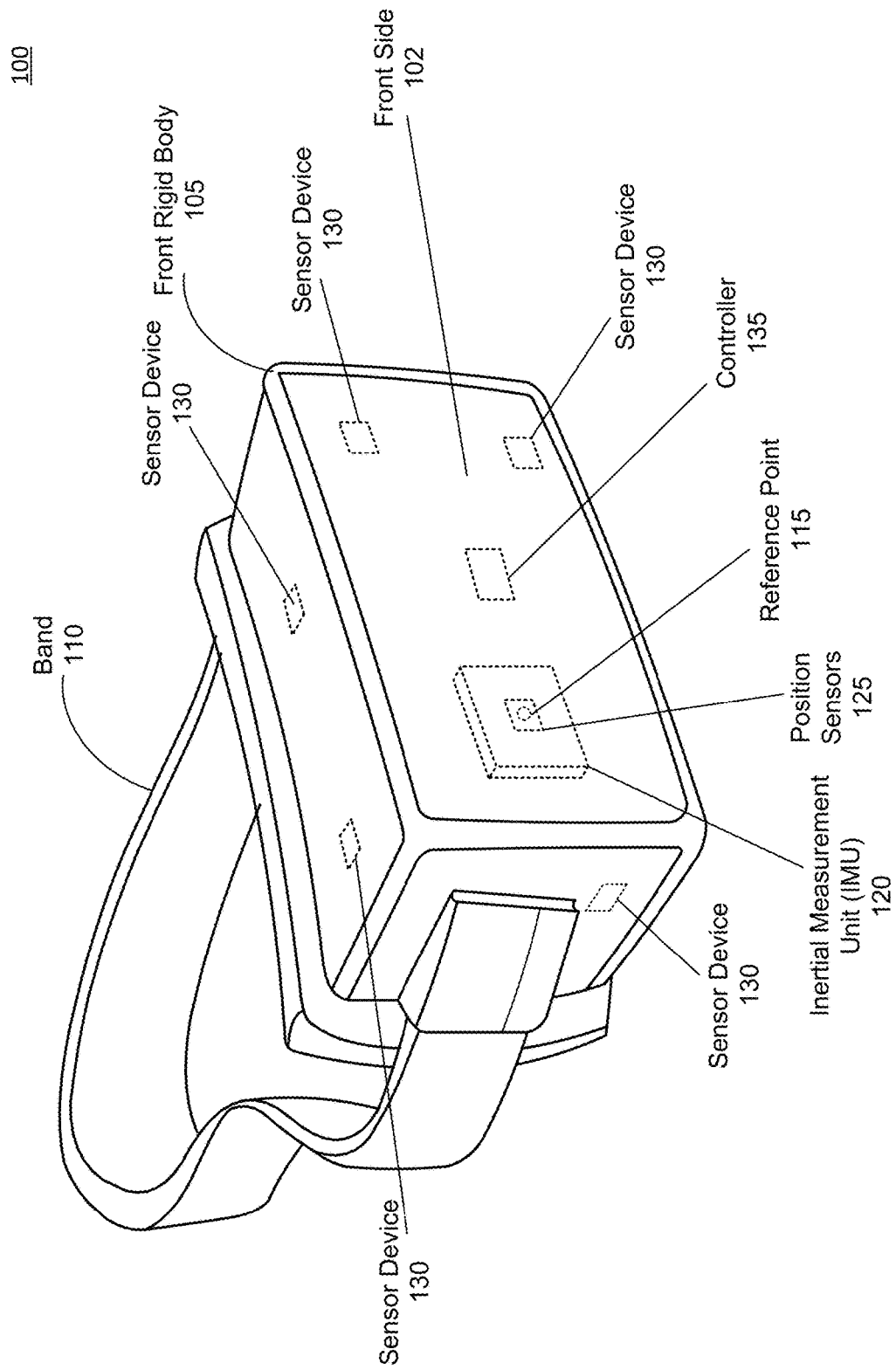
FIG. 1A is a diagram of a head-mounted display (HMD), in accordance with one or more examples of the present disclosure.

Examples are described herein in the context of heterogeneous memory systems. Those of ordinary skill in the art will realize that the following description is illustrative only and is not intended to be in any way limiting. Reference will now be made in detail to implementations of examples as illustrated in the accompanying drawings. The same reference indicators will be used throughout the drawings and the following description to refer to the same or like items.

In the interest of clarity, not all of the routine features of the examples described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another.

The disclosed techniques may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some examples, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

A stacked sensor system for determining various features of an environment is presented herein, which may be integrated into an artificial reality system. The stacked sensor system includes a plurality of stacked sensor layers. Each sensor layer of the plurality of stacked sensor layers may represent a signal processing layer for performing a specific signal processing function. Analog sensor data related to intensities of light reflected from the environment can be captured by a photodetector layer located on top of the stacked sensor system. The captured analog sensor data can be converted from analog domain to digital domain, e.g., via an analog-to-digital conversion (ADC) layer located beneath the photodetector layer. The digital sensor data can be then provided to at least one signal processing layer of the stacked sensor system located beneath the ADC layer. The at least one signal processing layer would process the digital sensor data to determine one or more features of the environment.

In some examples, a plurality of stacked sensor systems is integrated into a HMD. The stacked sensor systems (e.g., sensor devices) may capture data describing various features of an environment, including depth information of a local area surrounding some or all of the HMD. The HMD displays content to a user wearing the HMD. The HMD may be part of an artificial reality system. The HMD further includes an electronic display and an optical assembly. The electronic display is configured to emit image light. The optical assembly is configured to direct the image light to an eye box of the HMD corresponding to a location of a user's eye. The image light may comprise the depth information for the local area determined by at least one of the plurality of stacked sensor systems.

In some other examples, a plurality of stacked sensor systems can be integrated into an eyeglass-type platform representing a near-eye display (NED). The NED may be part of an artificial reality system. The NED presents media to a user. Examples of media presented by the NED include one or more images, video, audio, or some combination thereof. The NED further includes an electronic display and an optical assembly. The electronic display is configured to emit image light. The optical assembly is configured to direct the image light to an eye box of the NED corresponding to a location of a user's eye. The image light may comprise the depth information for the local area determined by at least one of the plurality of stacked sensor systems.

FIG. 1A is a diagram of a HMD 100, in accordance with one or more examples. The HMD 100 may be part of an artificial reality system. In examples that describe AR system and/or a MR system, portions of a front side 102 of the HMD 100 are at least partially transparent in the visible band (~380 nm to 750 nm), and portions of the HMD 100 that are between the front side 102 of the HMD 100 and an eye of the user are at least partially transparent (e.g., a partially transparent electronic display). The HMD 100 includes a front rigid body 105, a band 110, and a reference point 115.

The front rigid body 105 includes one or more electronic display elements (not shown in FIG. 1A), one or more integrated eye tracking systems (not shown in FIG. 1A), an Inertial Measurement Unit (IMU) 120, one or more position sensors 125, and the reference point 115. In the embodiment shown by FIG. 1A, the position sensors 125 are located within the IMU 120, and neither the IMU 120 nor the position sensors 125 are visible to a user of the HMD 100. The IMU 120 is an electronic device that generates IMU data based on measurement signals received from one or more of the position sensors 125. A position sensor 125 generates one or more measurement signals in response to motion of the HMD 100. Examples of position sensors 125 include: one or more accelerometers, one or more gyroscopes, one or more magnetometers, another suitable type of sensor that detects motion, a type of sensor used for error correction of the IMU 120, or some combination thereof. The position sensors 125 may be located external to the IMU 120, internal to the IMU 120, or some combination thereof.

The HMD 100 includes a distributed network of sensor devices (cameras) 130, which may be embedded into the front rigid body 105. Note that, although not shown in FIG. 1A, at least one sensor device 130 may be also embedded into the band 110. Each sensor device 130 may be implemented as a camera of a relatively small size. The distributed network of sensor devices 130 may replace a plurality of large conventional cameras. In some examples, each sensor device 130 of the distributed network embedded in the HMD 100 is implemented as a tiny chip camera with a limited predefined resolution, e.g., each sensor device 130 may include an array of 100×100 pixels or an array of 200×200 pixels. In some examples, each sensor device 130 in the distributed network has a field-of-view that does not overlap with a field-of-view of any other sensor device 130 integrated into the HMD 100. This is in contrast to overlapping field-of-views of large conventional cameras, which may cause capturing a large amount of overlapping data from a surrounding area. The HMD 100 may also include an imaging aperture associated with each sensor device 130 (not shown in FIG. 1A). A sensor device 130 may capture light reflected from the surrounding area through the imaging aperture.

Note that it would be impractical for each sensor device 130 in the distributed network of sensor devices 130 to have its own direct link (bus) to a central processing unit (CPU) or a controller 135 embedded into the HMD 100. Instead, each individual sensor device 130 may be coupled to the controller 135 via a shared bus (not shown in FIG. 1A) in a scalable manner, thus providing a scalable network of sensor devices 130 embedded into the HMD 100. The scalable network of sensor devices 130 can be viewed as a redundant system. Combined together, the sensor devices 130 cover a much larger field-of-view (e.g., 360 degrees) than typically deployed by large conventional cameras (e.g., 180 degrees). The wider field-of-view obtained by the sensor devices 130 provides increased robustness.

Note that it is not required to always keep active (i.e., turned on) all the sensor devices 130 embedded into the HMD 100. In some examples, the controller 135 is configured to dynamically activate a first subset of the sensor devices 130 and deactivate a second subset of the sensor devices 130, e.g., based on a specific situation. In one or more examples, depending on a particular simulation running on the HMD 100, the controller 135 may deactivate a certain portion of the sensor devices 130. For example, after locating a preferred part of an environment for scanning, specific sensor devices 130 can remain active, whereas other sensor devices 130 can be deactivated in order to save power dissipated by the distributed network of sensor devices 130.

A sensor device 130 or a group of sensor devices 130 can, e.g., track, during a time period, one or more moving objects and specific features related to the one or more moving objects. The features related to the moving objects obtained during the time period may be then passed to another sensor device 130 or another group of sensor devices 130 for continuous tracking during a following time period, e.g., based on instructions from the controller 135. For example, the HMD 100 may use the extracted features in the scene as a "land marker" for user localization and head pose tracking in a three-dimensional world. A feature associated with a user's head may be extracted by, e.g., one sensor device 130 at a time instant. In a next time instant, the user's head may move and another sensor device 130 may be activated to locate the same feature for performing head tracking. The controller 135 may be configured to predict which new sensor device 130 could potentially capture the same feature of a moving object (e.g., the user's head). In one or more examples, the controller 135 may utilize the IMU data obtained by the IMU 120 to perform coarse prediction. In this scenario, information about the tracked feature may be passed from one sensor device 130 to another sensor device 130, e.g., based on the coarse prediction. A number of active sensor devices 130 may be dynamically adjusted (e.g., based on instructions from the controller 135) in accordance with a specific task performed at a particular time instant. Furthermore, one sensor device 130 can perform an extraction of a particular feature of an environment and provide extracted feature data to the controller 135 for further processing and passing to another sensor device 130. Thus, each sensor device 130 in the distributed network of sensor devices 130 may process a limited amount of data. In contrast, conventional sensor devices integrated into a HMD system typically perform continuous processing of large amounts of data, which consumes much more power.

In some examples, each sensor device 130 integrated into the HMD 100 can be configured for a specific type of processing. For example, at least one sensor device 130 can be customized for tracking various features of an environment, e.g., determining sharp corners, hand tracking, etc. Furthermore, each sensor device 130 can be customized to detect one or more particular landmark features, while ignoring other features. In some examples, each sensor device 130 can perform early processing that provides information about a particular feature, e.g., coordinates of a feature and feature description. To support the early processing, certain processing circuitry may be incorporated into the sensor device 130, as discussed in more detail in conjunction with FIGS. 2-5. The sensor device 130 can then pass, e.g., to the controller 135, data obtained based upon the early processing, thus reducing an amount of data being communicated between the sensor device 130 and the controller 135. In this way, a frame rate of the sensor device 130 can increase while preserving a bandwidth requirement between the sensor device 130 and the controller 135. Furthermore, power dissipation and processing latency of the controller 135 can be reduced as partial processing is performed at the sensor device 130, and computational burden of the controller 135 is reduced and distributed to one or more sensor devices 130. Another advantage of the partial and early processing performed at the sensor device 130 includes reduction in memory requirement for storage of image frames on an internal memory of the controller 135 (not shown in FIG. 1A). Additionally, power consumption at the controller 135 may be reduced as less memory access leads to a lower power dissipation.

In an embodiment, a sensor device 130 can include an array of 100×100 pixels or an array of 200×200 pixels coupled to processing circuitry customized for extracting of, e.g., up to 10 features of an environment surrounding some or all of the HMD 100. In another embodiment, processing circuitry of a sensor device 130 can be customized to operate as a neural network trained to track, e.g., up to 20 joint locations of a user's hand, which may be required for performing accurate hand tracking. In yet other embodiment, at least one sensor device 130 can be employed for face tracking where, e.g., a user's mouth and facial movements can be captured. In this case, the at least one sensor device 130 can be oriented inward or downward to facilitate tracking of user's facial features.

Note that each sensor device 130 integrated into the HMD 100 may provide a level of signal-to-noise ratio (SNR) above a threshold level defined for that sensor device 130. Because a sensor device 130 is customized for a particular task, sensitivity of the customized sensor device 130 can be improved in comparison with conventional cameras. Also note that the distributed network of sensor devices 130 is a redundant system and it is possible to select (e.g., by the controller 135) a sensor device 130 of the distributed network that produces a preferred level of SNR. In this manner, tracking accuracy and robustness of the distributed network of sensor devices 130 can be greatly improved. Each sensor device 130 may be also configured to operate in an extended wavelength range, e.g., in the infrared and/or visible spectrum.

In some examples, a sensor device 130 includes a photodetector layer with an array of silicon-based photodiodes. In alternate examples, a photodetector layer of a sensor device 130 can be implemented using a material and technology that is not silicon based, which may provide improved sensitivity and wavelength range. In one embodiment, a photodetector layer of a sensor device 130 is based on an organic photonic film (OPF) photodetector material suitable for capturing light having wavelengths larger than 1000 nm. In another embodiment, a photodetector layer of a sensor device 130 is based on Quantum Dot (QD) photodetector material. A QD-based sensor device 130 can be suitable for, e.g., integration into AR systems and applications related to outdoor environments at low visibility (e.g., at night). Available ambient light is then mostly located in the long wavelength non-visible range between, e.g., approximately 1 μm and 2.5 μm, i.e., in the short wave infrared range. The photodetector layer of the sensor device 130 implemented based on an optimized QD film can detect both visible and short wave infrared light, whereas the silicon based film may be sensitive only to wavelengths of light around approximately 1.1 μm.

In some examples, the controller 135 embedded into the front rigid body 105 and coupled to the sensor devices 130 of the distributed sensor network is configured to combine captured information from the sensor devices 130. The controller 135 may be configured to properly integrate data associated with different features collected by different sensor devices 130. In some examples, the controller 135 determines depth information for one or more objects in a local area surrounding some or all of the HMD 100, based on the data captured by one or more of the sensor devices 130.

Figure 1B:
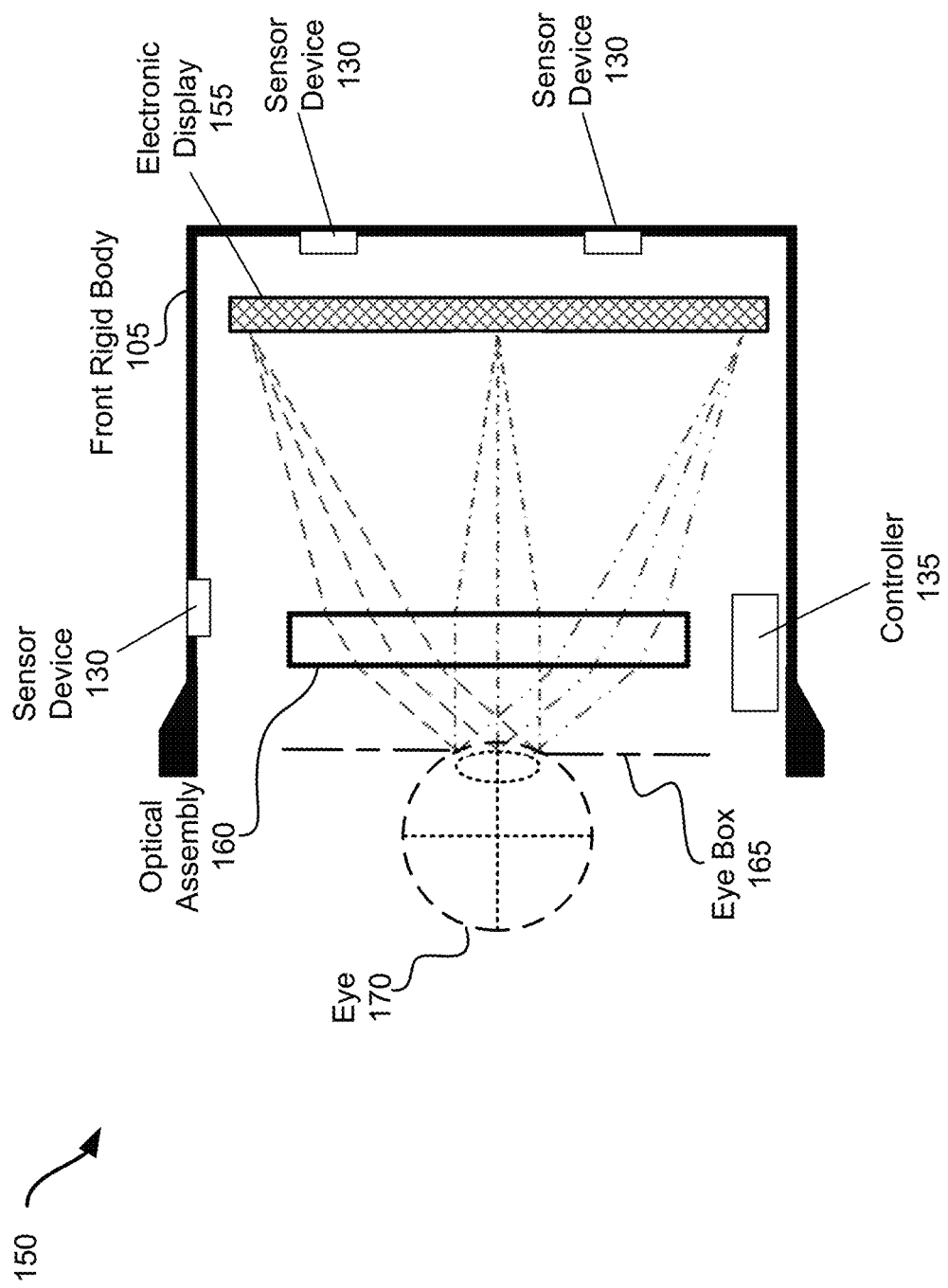
FIG. 1B is a cross section of a front rigid body of the HMD in FIG. 1A, in accordance with one or more examples of the present disclosure.

FIG. 1B is a cross section 150 of the front rigid body 105 of the HMD 100 shown in FIG. 1A, in accordance with one or more examples. The front rigid body 105 includes the sensor devices 130, the controller 135 coupled to the sensor devices 130, an electronic display 155 and an optical assembly 160. The electronic display 155 and the optical assembly 160 together provide image light to an eye box 165. The eye box 165 is a region in space that is occupied by a user's eye 170. For purposes of illustration, FIG. 1B shows a cross section 150 associated with a single eye 170, but another optical assembly 160, separate from the optical assembly 160, provides altered image light to another eye of the user.

The electronic display 155 emits image light toward the optical assembly 160. In various examples, the electronic display 155 may comprise a single electronic display or multiple electronic displays (e.g., a display for each eye of a user). Examples of the electronic display 155 include: a liquid crystal display (LCD), an organic light emitting diode (OLED) display, an inorganic light emitting diode (ILED) display, an active-matrix organic light-emitting diode (AMOLED) display, a transparent organic light emitting diode (TOLED) display, some other display, a projector, or some combination thereof. The electronic display 155 may also include an aperture, a Fresnel lens, a convex lens, a concave lens, a diffractive element, a waveguide, a filter, a polarizer, a diffuser, a fiber taper, a reflective surface, a polarizing reflective surface, or any other suitable optical element that affects the image light emitted from the electronic display 155. In some examples, the electronic display 155 may have one or more coatings, such as anti-reflective coatings.

The optical assembly 160 receives image light emitted from the electronic display 155 and directs the image light to the eye box 165 of the user's eye 170. The optical assembly 160 also magnifies the received image light, corrects optical aberrations associated with the image light, and the corrected image light is presented to a user of the HMD 100. In some examples, the optical assembly 160 includes a collimation element (lens) for collimating beams of image light emitted from the electronic display 155. At least one optical element of the optical assembly 160 may be an aperture, a Fresnel lens, a refractive lens, a reflective surface, a diffractive element, a waveguide, a filter, or any other suitable optical element that affects image light emitted from the electronic display 155. Moreover, the optical assembly 160 may include combinations of different optical elements. In some examples, one or more of the optical elements in the optical assembly 160 may have one or more coatings, such as anti-reflective coatings, dichroic coatings, etc. Magnification of the image light by the optical assembly 160 allows elements of the electronic display 155 to be physically smaller, weigh less, and consume less power than larger displays. Additionally, magnification may increase a field-of-view of the displayed media. For example, the field-of-view of the displayed media is such that the displayed media is presented using almost all (e.g., 110 degrees diagonal), and in some cases all, of the user's field-of-view. In some examples, the optical assembly 160 is designed so its effective focal length is larger than the spacing to the electronic display 155, which magnifies the image light projected by the electronic display 155. Additionally, in some examples, the amount of magnification may be adjusted by adding or removing optical elements.

In some examples, the front rigid body 105 further comprises an eye tracking system (not shown in FIG. 1B) that determines eye tracking information for the user's eye 170. The determined eye tracking information may comprise information about a position (including orientation) of the user's eye 170 in the eye box 165, i.e., information about an angle of an eye-gaze. In one embodiment, the eye tracking system illuminates the user's eye 170 with structured light. The eye tracking system can determine the position of the user's eye 170 based on deformations in a pattern of structured light reflected from a surface of the user's eye and captured by a camera of the eye tracking system. In another embodiment, the eye tracking system determines the position of the user's eye 170 based on magnitudes of image light captured over a plurality of time instants.

In some examples, the front rigid body 105 further comprises a varifocal module (not shown in FIG. 1B). The varifocal module may adjust focus of one or more images displayed on the electronic display 155, based on the eye tracking information obtained from the eye tracking system. In one embodiment, the varifocal module adjusts focus of the displayed images and mitigates vergence-accommodation conflict by adjusting a focal distance of the optical assembly 160 based on the determined eye tracking information. In other embodiment, the varifocal module adjusts focus of the displayed images by performing foveated rendering of the one or more images based on the determined eye tracking information.

Figure 2:
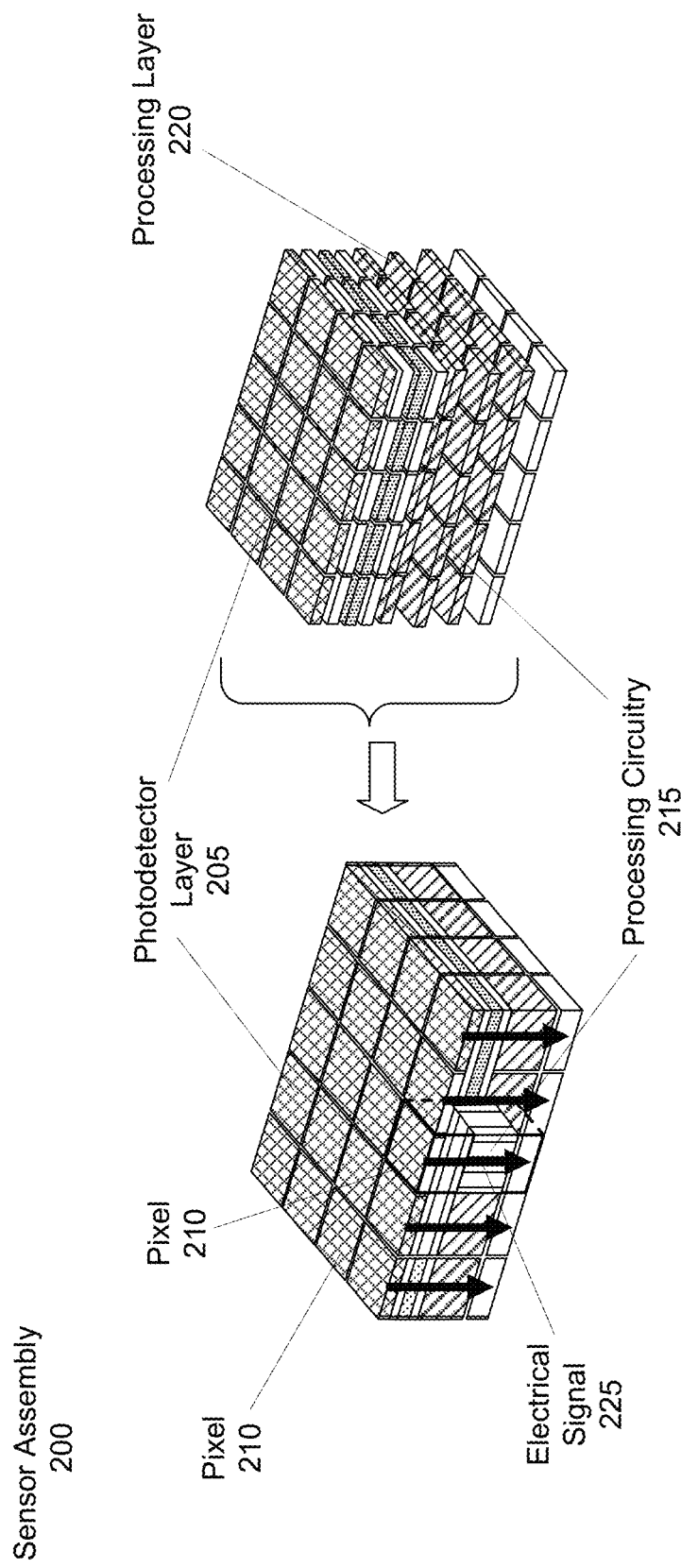
FIG. 2 is a cross-sectional view of a stacked sensor system with a plurality of stacked sensor layers, which may be part of the HMD in FIG. 1A, in accordance with one or more examples of the present disclosure.

FIG. 2 is a cross-sectional view of a sensor assembly 200 with a plurality of stacked sensor layers, in accordance with one or more examples. The sensor assembly 200 may be an embodiment of a sensor device 130 of the HMD 100 in FIG. 1A. In some examples, the sensor assembly 200 includes a plurality of layers of silicon stacked on top of each other. In alternate examples, at least one layer in the plurality of stacked sensor layers of the sensor assembly 200 is implemented based on a non-silicon photo-detection material. A top sensor layer in the sensor assembly 200 may be customized for photo-detection and can be referred to as a photodetector layer 205. The photodetector layer 205 may comprise a two-dimensional array of pixels 210. Each pixel 210 of the photodetector layer 205 may be directly coupled, e.g., via copper bonding (not shown in FIG. 2), with processing circuitry 215 of a processing layer 220 located within the sensor assembly 200 beneath the photodetector layer 205.

Stacking of multiple sensor layers (wafers) as shown in FIG. 2 allows copper bonding between the photodetector layer 205 and the processing layer 220 on per pixel resolution. By putting two wafers face to face, a copper pad connection from one wafer in the sensor assembly 200 to another wafer in the sensor assembly 200 can be made at per pixel level, i.e., an electrical signal 225 corresponding to a single pixel can be sent from the photodetector layer 205 to the processing circuitry 215 of the processing layer 220. In one or more examples, an interconnection between the processing layer 220 and at least one other layer in a multiple stacked structure of the sensor assembly 200 can be achieved using, e.g., "through silicon via" (TSV) technology. Due to TSV's geometry size (e.g., around 10 μm), the interconnection between the processing layer 220 and the at least one other layer of the sensor assembly 200 is not at a pixel level, but can still be very dense. In some examples, more miniaturized TSVs (e.g., micro-TSV) with a pitch similar at 1 micrometer or below can also be used between processing layer 220 and layer and the at least one other layer of the sensor assembly 200 to allow for a finer three-dimensional connection.

In some examples, by employing wafer scaling, the sensor assembly 200 of a small size can be efficiently implemented. For example, a wafer of the photodetector layer 205 can be implemented using, e.g., 45 nm process technology, whereas a wafer of the processing layer 220 can be implemented using more advanced process technology, e.g., 28 nm or smaller process technology. Since a transistor in the 28 nm process technology occupies a very small area, a large number of transistors can be fit into a small area of the processing layer 220. In the illustrative embodiment, the sensor assembly 200 can be implemented as a cube of 1 mm×1 mm×1 mm having a power dissipation of approximately 10 mW. In comparison, conventional sensors (cameras) comprise a photodetector pixel array and processing circuitry implemented on a single silicon layer, and a total sensor area is determined as a sum of areas of all functional blocks. Without the benefit of vertical stacking as in the embodiment shown in FIG. 2, the conventional sensors occupy much larger areas than the sensor assembly 200.

Figure 3A:
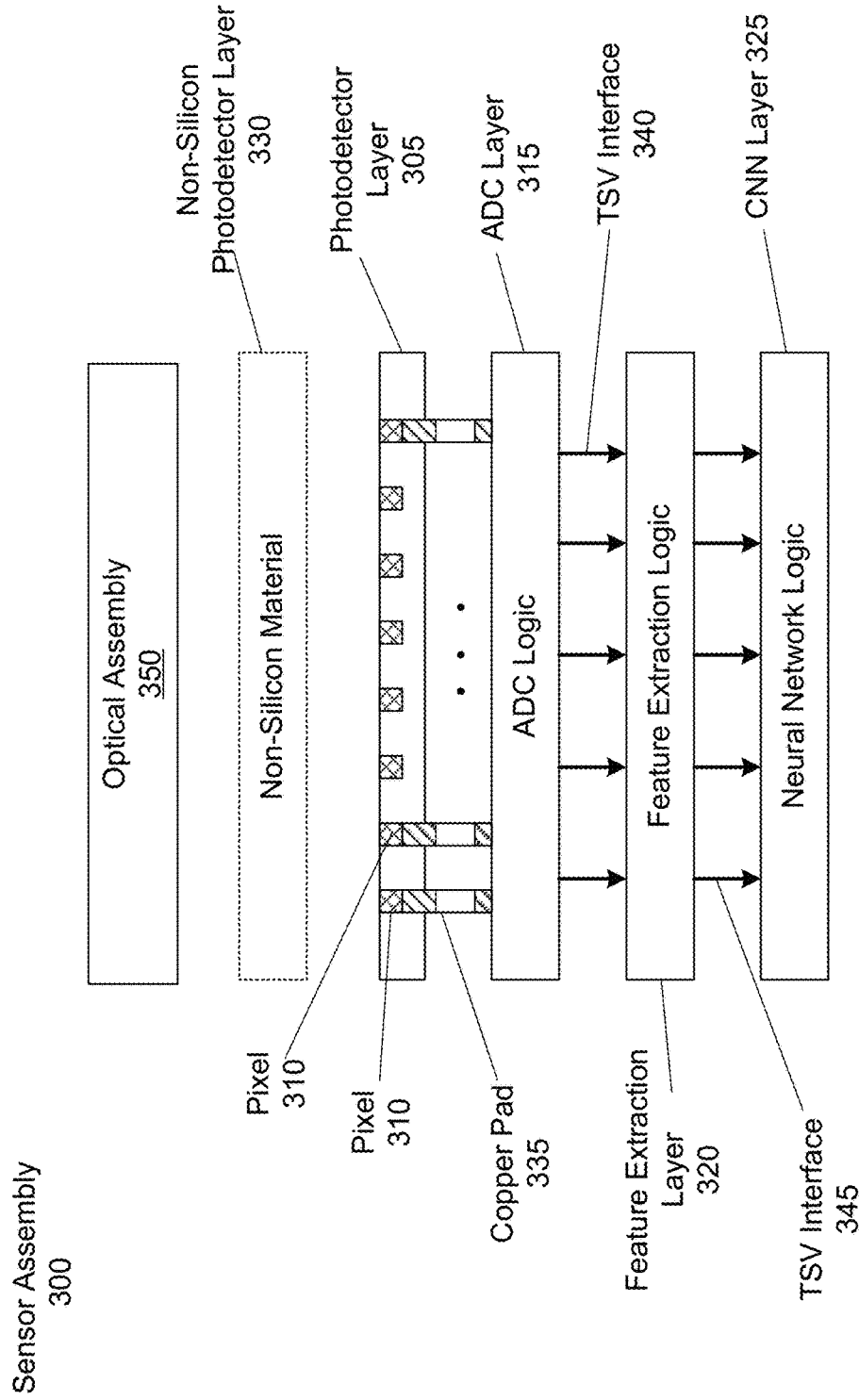
FIG. 3A and FIG. 3B are detailed view of a plurality of stacked sensor layers, which may be part of the stacked sensor system in FIG. 2, and their operations, in accordance with one or more examples of the present disclosure.

FIG. 3A is a detailed view of a sensor assembly 300 comprising a plurality of stacked sensor layers, in accordance with one or more examples. The sensor assembly 300 may be an embodiment of the sensor device 130 in FIG. 1A, and an embodiment of the sensor assembly 200 in FIG. 2. In some examples, a photodetector layer 305 may be positioned on top of the sensor assembly 300 and may comprise an array of pixels 310, e.g., a two-dimensional array of photodiodes. As processing circuitry of the sensor assembly 300 can be integrated into other layers beneath the photodetector layer 305, the photodetector layer 305 can be customized only for photo-detection. Thus, an area of the photodetector layer 305 can be relatively small and the photodetector layer 305 may dissipate a limited amount of power. In some examples, an ADC layer 315 customized for conversion of analog signals (e.g., intensities of light captured by the photodetector layer 305) into digital data may be placed immediately beneath the photodetector layer 305. The ADC layer 315 may be configured to convert (e.g., by its processing circuitry or ADC logic, details not shown in FIG. 3) analog values of light intensities captured by the pixels 310 of the photodetector layer 305 into digital values corresponding to, e.g., image frame data. The ADC layer 315 may also include a memory (not shown in FIG. 3) for storing the digital values obtained after the conversion.

In some examples, a feature extraction layer 320 with processing circuitry customized for feature extraction may be placed immediately beneath the ADC layer 315. The feature extraction layer 320 may also include a memory for storing, e.g., digital sensor data generated by the ADC layer 315. The feature extraction layer 320 may be configured to extract one or more features from the digital sensor data obtained from the ADC layer 315. As the feature extraction layer 320 is customized for extracting specific features, the feature extraction layer 320 may be efficiently designed to occupy a small area size and dissipate a limited amount of power. More details about the feature extraction layer 320 are provided in conjunction with FIG. 4.

In some examples, a convolutional neural network (CNN) layer 325 may be placed immediately beneath the feature extraction layer 320, or in the same layer as the processing circuitry of feature extraction. In some examples the CNN may perform feature extraction itself. A neural network logic of the CNN layer 325 may be trained and optimized for particular input data, e.g., data with information about a specific feature or a set of features obtained by the feature extraction layer 320. As the input data are fully expected, the neural network logic of the CNN layer 325 may be efficiently implemented and customized for a specific type of feature extraction data, resulting into a reduced processing latency and lower power dissipation.

In some examples, the CNN layer 325 is designed to perform image classification and recognition applications. Training of the neural network logic of the CNN layer 325 may be performed offline, and network weights in the neural network logic of the CNN layer 325 may be trained prior to utilizing the CNN layer 325 for image classification and recognition. In one or more examples, the CNN layer 325 is implemented to perform inference, i.e., to apply the trained network weights to an input image to determine an output, e.g., an image classifier. In contrast to designing a generic CNN architecture, the CNN layer 325 may be implemented as a custom and dedicated neural network, and can be designed for a preferred level of power dissipation, area size and efficiency (computational speed).

Figure 3B:
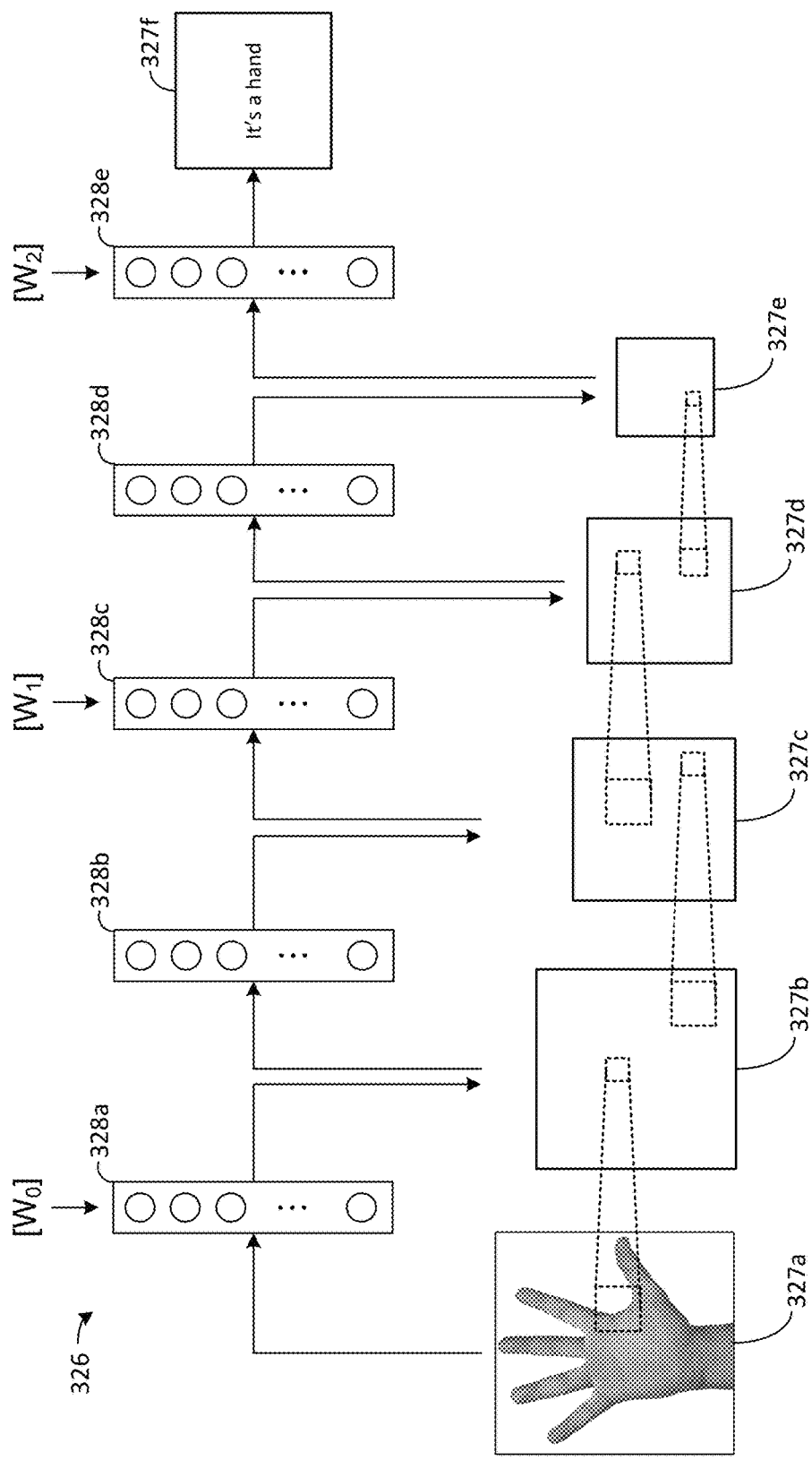

FIG. 3B illustrates an example architecture of CNN 326 that can be implemented in CNN layer 325. CNN 326 may include four main operations, which include, but are not limited to: (1) convolution; (2) non-linearity function (e.g., ReLU); (3) pooling or sub-sampling; and (4) classification (fully-connected layer). These operations may be the basic building blocks of every convolutional neural network. Different CNNs may have different combinations of these four main operations.

An image to be classified, such as input image 327a, may be represented by a matrix of pixel values. Input image 327a may include multiple channels, each channel representing a certain component of the image. For example, an image from a digital camera may have a red channel, a green channel, and a blue channel. Each channel may be represented by a 2-D matrix of pixels having pixel values in the range of 0 to 255 (i.e., 8-bit). A gray-scale image may have only one channel. In the following description, the processing of a single image channel using CNN 326 is described. Other channels may be processed similarly.

As shown in FIG. 3B, input image 327a may be processed by a first convolution layer 328a using a first weight array (labelled [W0] in FIG. 3B). First convolution layer 326a may include multiple nodes, with each node assigned to multiply a pixel of input image 327a with a weight in first weights array. As part of the convolution operation, blocks of pixels of input image 327a can be multiplied with first weights array to generate a sum. Each sum is then processed by a non-linear activation function (e.g., ReLU, software max, etc.) to generate an output, and the outputs can form an output matrix 327b. The first weights array can be used to, for example, extract certain basic features (e.g., edges, etc.) from input image 327a, and output matrix 327b can represent a distribution of the basic features as a basic feature map. Output matrix (or feature map) 327b may be passed to a pooling layer 328b, where output matrix 327b may be subsampled or down-sampled by pooling layer 328b to generate a matrix 327c.

Matrix 327c may be processed by a second convolution layer 328c using a second weights array (labelled [W1 in FIG. 3B]. The second weights array can be used to, for example, identify patterns of features specific for an object, such as a hand, from matrix 327c. As part of the convolution operation, blocks of pixels of matrix 327c can be multiplied with the second weights array to generate a sum. Each sum is then processed by a non-linear activation function (e.g., ReLU, softmax, etc.) to generate an output, and the outputs can form an output matrix 327d. A non-linear activation function (e.g., ReLU) may also be performed by the second convolution layer 328c as in the first convolution layer 328a. An output matrix 327c (or feature map) from second convolution layer 328c may represent a distribution of features representing a hand. Output matrix 327d may be passed to a pooling layer 328d, where output matrix 327d may be subsampled or down-sampled to generate a matrix 327e.

Matrix 327e can then be passed through a fully-connected layer 328e, which can include a multi-layer perceptron (MLP). Fully-connected layer 328e can perform a classification operation based on matrix 327e (e.g., to classify whether the object in image 327a represents a hand). Fully-connected layer 328e can also multiply matrix 327e with a third weights array (labelled [W2] in FIG. 3B) to generate sums, and the sums can also be processed by an activation function (e.g., ReLu, softmax, etc.) to generate a classification output 327f.

CNN 326 can be implemented in CNN layer 325 using various techniques. For example, as to be described below, CNN 326 can be implemented in machine learning hardware accelerator supported with in-memory compute. The in-memory compute can include, for example, performing read/write operations at a memory to perform matrix transpose, reshaping, etc. In some examples, the in-memory compute can include matrix multiplication which can be performed by an array of memristors as to be described in FIG. 5.

In some examples, each sensor layer 305, 315, 320, 325 in the sensor assembly 300 customized for a particular processing task can be implemented using silicon-based technology. Alternatively, at least one of the sensor layers 305, 315, 320, 325 may be implemented based on a non-silicon photo-detection material, e.g., OPF photo-detection material and/or QD photo-detection material. In some examples, instead of the silicon-based photodetector layer 305 that includes the array of pixels 310 based on photodiodes, a non-silicon photodetector layer 330 can be placed on top of the sensor assembly 300. In one embodiment, the non-silicon photodetector layer 330 is implemented as a photodetector layer of QD photo-detection material, and can be referred to as a QD photodetector layer. In some examples, the non-silicon photodetector layer 330 is implemented as a photodetector layer of OPF photo-detection material, and can be referred to as an OPF photodetector layer. In some examples, more than one photodetector layer can be used for photo detection in the sensor assembly 300, e.g., at least one silicon-based photodetector layer 305 and at least one non-silicon based photodetector layer 330.

In some examples, a direct copper bonding can be used for inter-layer coupling between the photodetector layer 305 and the ADC layer 315. As shown in FIG. 3A, a copper pad 335 may be used as an interface between a pixel 310 in the photodetector layer 305 and processing circuitry (ADC logic) of the ADC layer 315. For example, in the case of photodetector layer 305 implemented as a 20M-pixel camera, up to approximately 20 Mega copper pad connections 335 may be implemented between the photodetector layer 305 and the processing circuitry of the ADC layer 315. Note that a pitch of the photodetector layer 305 can be relatively small, e.g., between approximately 1 μm and 2 μm.

In some examples, as discussed, interconnection between sensor layers located in the sensor assembly 300 beneath the photodetector layer 305 can be achieved using, e.g., TSV technology. Referring back to FIG. 3A, a TSV interface 340, which can include parallel TSVs and/or micro-TSVs, may interconnect the ADC logic/memory of the ADC layer 315 with the feature extraction logic of the feature extraction layer 320. The TSV interface 340 may provide digital sensor data obtained by the ADC layer 315 to the feature extraction layer 320 for extraction of one or more specific features, wherein the digital sensor data can be related to image data captured by the photodetector layer 305. Similarly, another TSV interface 345 may be used to interconnect the feature extraction logic of the feature extraction layer 320 with the neural network logic of the CNN layer 325. The TSV interface 345 may provide feature extraction data obtained by the feature extraction logic of the feature extraction layer 320 as inputs into the neural network logic of the CNN layer 325 for, e.g., image classification and/or recognition.

In some examples, an optical assembly 350 may be positioned on top of the silicon-based photodetector layer 305 (or the non-silicon based photodetector layer 330). The optical assembly 350 may be configured to direct at least a portion of light reflected from one or more objects in a local area surrounding the sensor assembly 300 to the pixels 310 of the silicon-based photodetector layer 305 (or sensor elements of the non-silicon based photodetector layer 330). In some examples, the optical assembly 350 can be implemented by stacking one or more layers of wafers (not shown in FIG. 3A) on top of the silicon-based photodetector layer 305 (or the non-silicon based photodetector layer 330). Each wafer of the optical assembly 350 may be implemented as a glass wafer and represents an individual lens element of the optical assembly 350. In one or more examples, a polymer-based material can be molded on a top surface and/or a bottom surface of the glass wafer to serve as a reflective surface of the individual lens element of the optical assembly 350. This technology can be referred to as the wafer level optics. Additionally, a spacer (not shown in FIG. 3) can be included between a pair of adjacent glass wafers (layers) in the optical assembly 350 to adjust a space between the adjacent glass layers.

In some examples, all glass wafers of the optical assembly 350 and all silicon wafers of the sensor layers 305, 315, 320, 325 can be manufactured and stacked together before each individual sensor-lens unit is diced from a wafer stack to obtain one instantiation of the sensor assembly 300. Once the manufacturing is finished, each cube obtained from the wafer stack becomes a complete, fully functional camera, e.g., the sensor assembly 300 of FIG. 3. It should be understood that the sensor assembly 300 does not require any plastic housing for the sensor layers 305, 315, 320, 325, which facilitates implementing the sensor assembly 300 as a cube of a predefined volume size smaller than a threshold volume.

In some examples, when the non-silicon based photodetector layer 330 (e.g., QD photodetector layer or OPF photodetector layer) is part of the sensor assembly 300, the non-silicon based photodetector layer 330 may be directly coupled to the ADC layer 315. Electrical connections between sensor elements (pixels) in the non-silicon based photodetector layer 330 and the ADC layer 315 may be made as copper pads. In this case, the non-silicon based photodetector layer 330 can be deposited on the ADC layer 315 after all the other sensor layers 315, 320, 325 are stacked. After the non-silicon based photodetector layer 330 is deposited on the ADC layer 315, the optical assembly 350 is applied on top of the non-silicon based photodetector layer 330.

Figure 4:
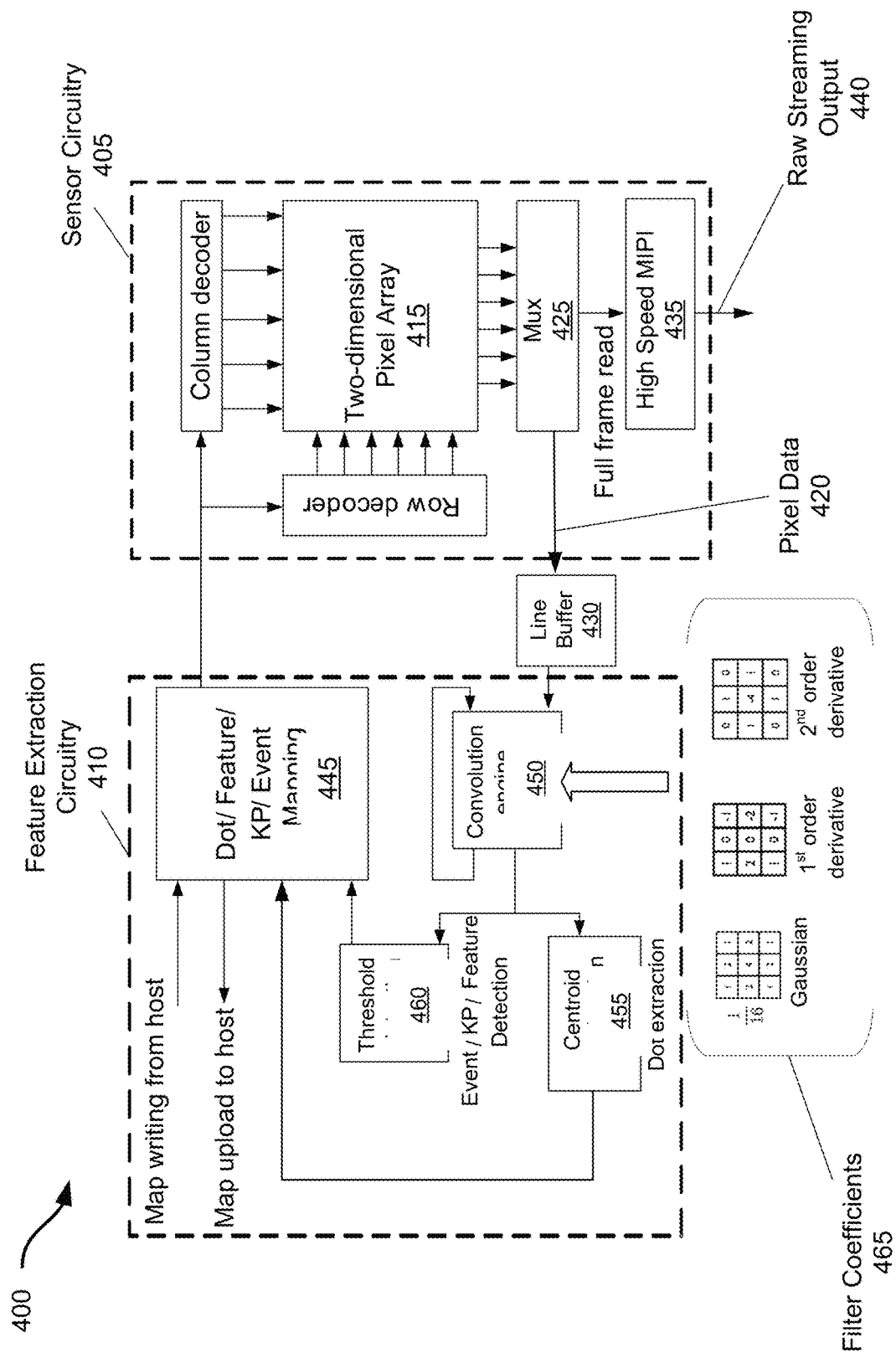
FIG. 4 is an example sensor architecture that consists of coupled sensor layers, which may be part of the stacked sensor system in FIG. 2, in accordance with one or more examples of the present disclosure.

FIG. 4 is an example sensor architecture 400 of coupled sensor layers in a stacked sensor assembly, in accordance with one or more examples. The sensor architecture 400 may include sensor circuitry 405 coupled to feature extraction circuitry 410, e.g., via TSV interface. The sensor architecture 400 may be implemented as part of at least two sensor layers of the sensor assembly 300 in FIG. 3. In some examples, the sensor circuitry 405 may be part of the photodetector layer 305 and the ADC layer 315, whereas the feature extraction circuitry 410 may be part of the feature extraction layer 320.

The sensor circuitry 405 may acquire and pre-process sensor data, before providing the acquired sensor data to the feature extraction circuitry 410, e.g., via a TSV interface. The sensor data may correspond to an image captured by a two-dimensional array of pixels 415, e.g., M×N array of digital pixels, where M and N are integers of same or different values. Note that the two-dimensional array of pixels 415 may be part of the photodetector layer 305 of the sensor assembly 300 of FIG. 3. Furthermore, the two-dimensional array of pixels 415 may include per pixel interface with ADC logic (not shown in FIG. 4), which may be part of the ADC layer 315 of FIG. 3. Pixel data 420 from an output of a multiplexer 425 may include digital sensor data related to the captured image. The pixel data 420 may be stored into a line buffer 430 and provided, e.g., via TSV interface, to the feature extraction circuitry 410 for extraction of one or more specific features. Note that a full frame read from the multiplexer 425 may be output via a high speed Mobile Industry Processor Interface (MIPI) 435 for producing a raw streaming output 440.

The feature extraction circuitry 410 may determine one or more features from the captured image represented by the pixel data 420. In the illustrative embodiment of FIG. 4, the feature extraction circuitry 410 includes a Dot/Feature/Key Point (KP)/Event mapping block 445, a convolution engine 450, a centroid estimation block 455, and a threshold detection block 460. The convolution engine 450 may process the pixel data 420 buffered in the line buffer 430 by applying, e.g., 3×3 convolution using various filter coefficients (kernels) 465, such as filter coefficients 465 for Gaussian filter, first order derivative, second order derivative, etc. The filtered data from the convolution engine 450 may be further fed into the threshold detection block 460 where a particular key feature or event in the captured image can be detected based on, e.g., filter and threshold settings. Location of the key feature/event determined by the threshold detection block 460 may be written into the mapping block 445. A map of one or more key features/events may be uploaded to, e.g., a host (not shown in FIG. 4); another map of key feature(s)/event(s) may be also written from the host to the mapping block 445. In an embodiment, the sensor architecture 400 can be used to measure depth information in a scene based on the structured light principle. In this case, a laser dot centroid can be extracted from the centroid estimation block 455, and the centroid may be written into the mapping block 445.

It should be understood that the sensor architecture 400 shown in FIG. 4 represent the illustrative embodiment. Other examples of the sensor circuitry 405 and/or the feature extraction circuitry 410 may include different and/or and additional processing blocks.

Figure 5:
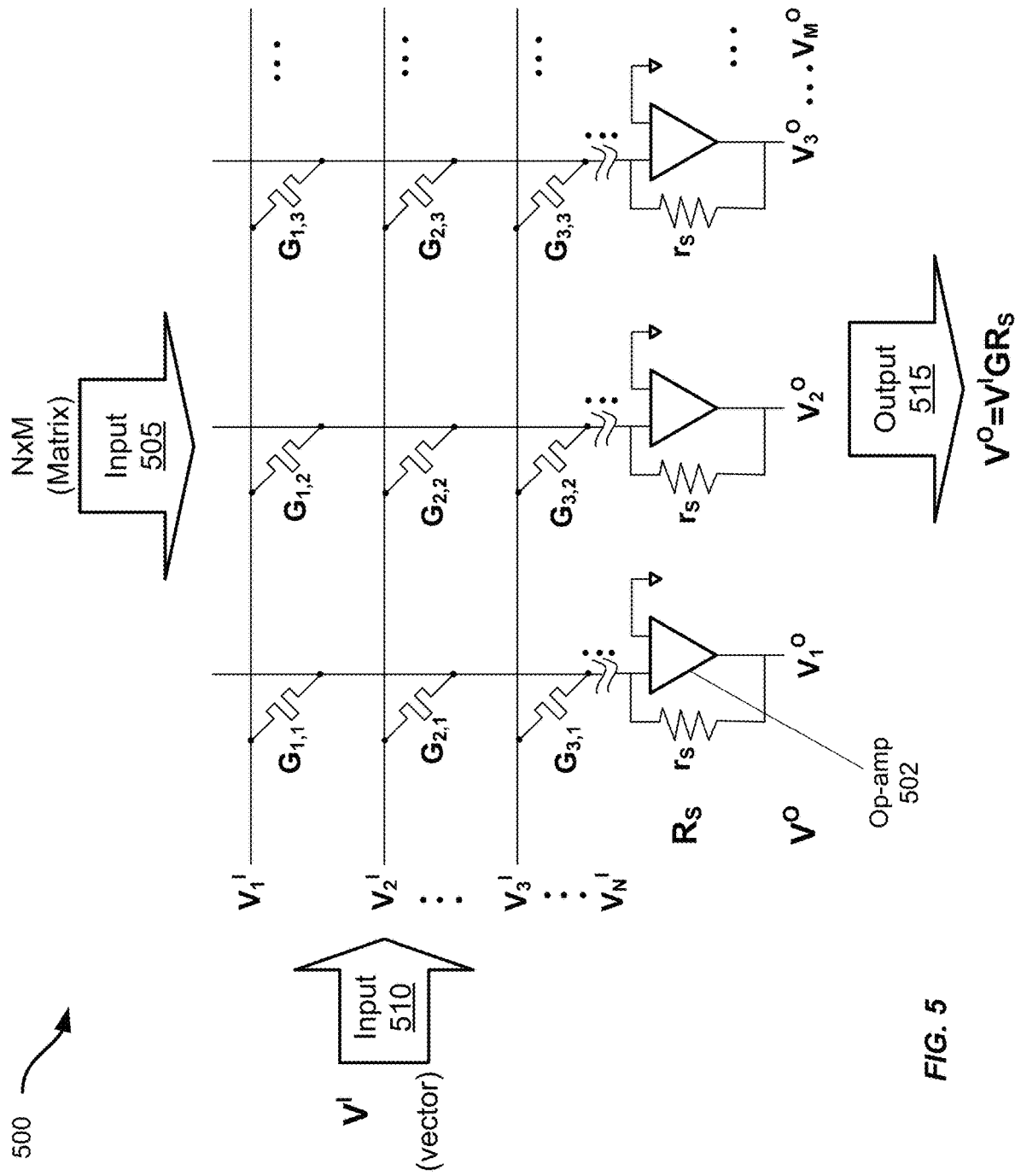
FIG. 5 is an example of a neural network based on an array of memristors, which may be part of the stacked sensor system in FIG. 2, in accordance with one or more examples of the present disclosure.

FIG. 5 illustrates an example of a neural network 500 based on an array of memristors, in accordance with one or more examples. The neural network 500 may be an embodiment of the neural network logic in the CNN layer 325 of the sensor assembly 300 of FIG. 3A. In some examples, the neural network 500 represents a CNN (e.g., CNN 326 of FIG. 3B) that is trained and utilized for certain processing based on machine learning algorithms, e.g., for image classification and/or recognition. Note that the feature extraction circuitry 410 of FIG. 4 and the neural network 500 can co-exist in an intelligent sensor system (e.g., the sensor assembly 300 of FIG. 3A) as more traditional computer vision algorithms, e.g., for depth extraction can be implemented on the feature extraction circuitry 410.

In some examples, the neural network 500 may be optimized for neuromorphic computing having a memristor crossbar suitable for performing vector-matrix multiplication. Learning in the neural network 500 is represented in accordance with a set of parameters that include values of conductance $G=G_{n,m}$ (n=1, 2, ..., N; m=1, 2, ..., M) and resistance RS (e.g., vector of M resistance values rS) at cross-bar points of the neural network 500. An op-amp 502 and its associated resistor rS serves as an output driver and a column-wise weighting coefficient of each column of memristor elements, respectively.

In some examples, instead of fetching parameters from, e.g., a dynamic random-access memory (DRAM), the parameters in the form of conductance and resistance values are directly available at the cross-bar points of the neural network 500 and can be directly used during computation, e.g., during the vector-matrix multiplication. The neural network 500 based on the memristor crossbar shown in FIG. 5 can have a dual function, i.e., the neural network 500 can be employed as a memory storage device and as a computational device. The neural network 500 can be thus referred to as a "compute in memory implementation" having a preferred level of power dissipation, area size and computational efficiency. The neural network 500 can efficiently replace combination of a memory storage device and a CPU, which makes the neural network 500 suitable for efficient implementation as part of the CNN layer 325 of the sensor assembly 300 of FIG. 3A.

Initial weights of the neural network 500, Gn,m, can be written via an input 505 with values organized in, e.g., N rows and M columns, which may represent a matrix input. In one or more examples, the matrix input 505 may correspond to a kernel for a convolution operation. In some examples, an input 510 may correspond to digital pixel values of an image, e.g., captured by the photodetector layer 305 and processed by ADC layer 315 and the feature extraction layer 320 of the sensor assembly 300 of FIG. 3A. The input 510 may include digital voltage values VI organized into a vector of e.g., N voltage values V1I, V2I, V3I, . . . , VNI During inference operation, the vector input 510 may be applied into the matrix input 505. An output 515 may be obtained as a result of multiplication between the vector input 510 and the matrix input 505, i.e., as a result of the vector-matrix multiplication. As shown in FIG. 5, the output 515 represents a vector of digital voltage values VO, i.e., M voltage values V1O, V2O, V3O, . . . , VMI, where VO=VIGRS. The output vector VO may be used for inference functions, such as object classification.

In some examples, the neural network 500 can be efficiently interfaced with the photodetector layer 305, the ADC layer 315 and the feature extraction layer 320 of the sensor assembly 300 of FIG. 3, e.g., via the TSV interface 345 between the feature extraction layer 320 and the CNN layer 325 (i.e., the neural network 500). Furthermore, the neural network 500 implemented based on the memristor cross-bar may avoid parallel-to-serial and serial-to-parallel conversion of data, which simplifies implementation and increases processing speed. Alternatively, the neural network 500 may be used for image segmentation and sematic applications, which can be enabled with the memristor cross-bar of FIG. 5 with different sets of learned coefficients.

Figure 6:
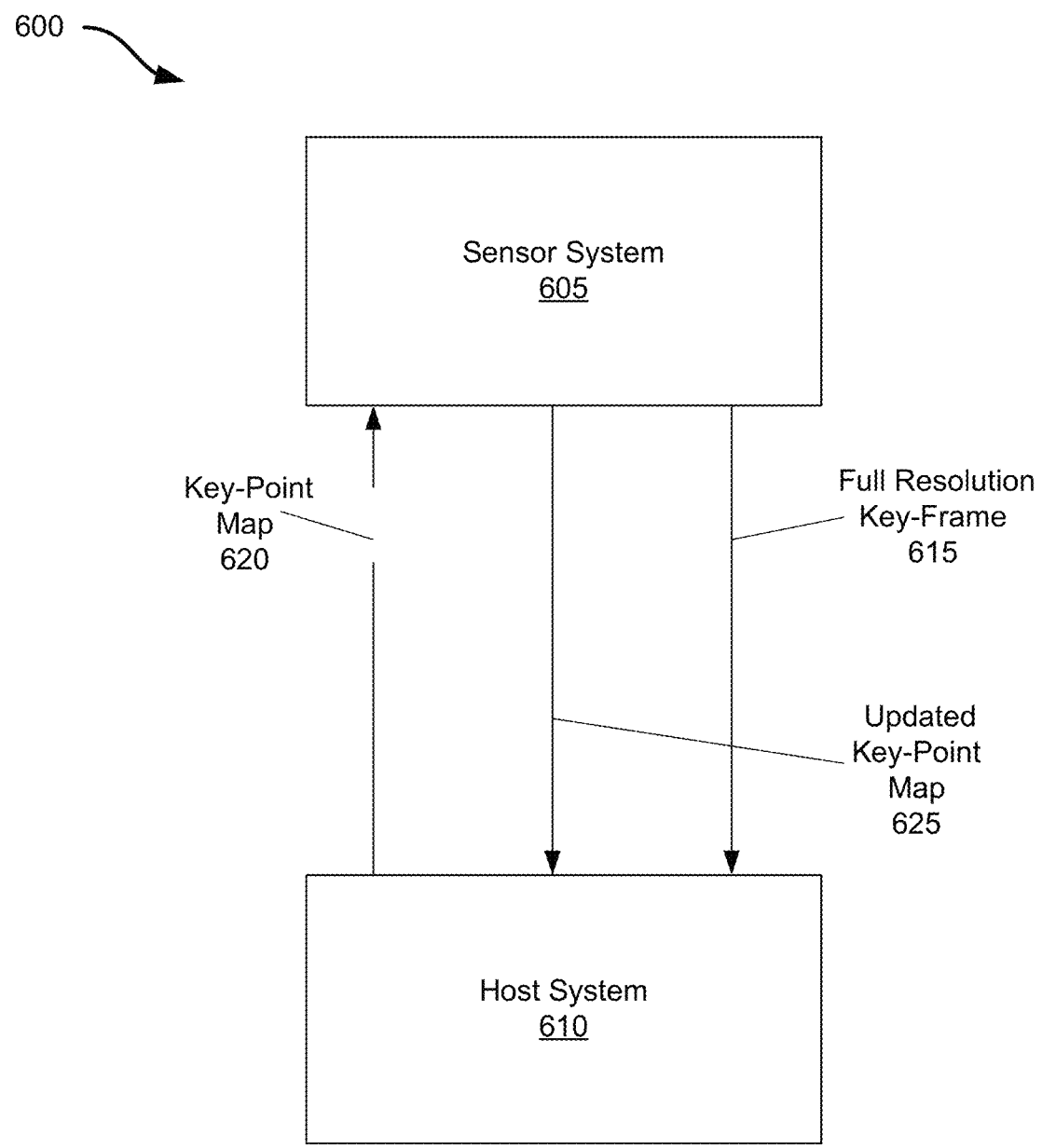
FIG. 6 is an example of a host-sensor closed loop system, in accordance with one or more examples of the present disclosure.

FIG. 6 is an example of a host-sensor closed loop system 600, in accordance with one or more embodiment. The host-sensor closed loop system 600 includes a sensor system 605 and a host system 610. The sensor system 605 can be an embodiment of the sensor device 130 in FIG. 1A, an embodiment of the sensor assembly 200 in FIG. 2 and/or an embodiment of the sensor assembly 300 in FIG. 3; the host system 610 can be an embodiment of the controller 135 in FIG. 1A. In some examples, the sensor system 605 may obtain one or more key features of e.g., a captured image of at least portion of an environment. The sensor system 605 may initially provide the one or more key features to the host system 610 as full resolution key-frame(s) 615 at a rate of, e.g., 10 frames per second. Based on the processed one or more full resolution key-frames 615, the host system 610 may be configured to predict one or more key points representing, e.g., future locations of the one or more key features in next image frame(s). The host system 610 may then provide a key-point map 620 to the sensor system 605 at a rate of, e.g., 10 frames per second.

After receiving the key-point map 620, the sensor system 605 may activate a portion of pixels, e.g., that correspond to a vicinity of the predicted feature(s). The sensor system 605 would then capture and process only those intensities of light related to the activated portion of pixels. By activating only the portion of pixels and processing only a portion of intensity values captured by the activated portion of pixels, power dissipated by the sensor system 605 can be reduced. The sensor system 605 may derive one or more updated locations of the one or more key features. The sensor system 605 may then send the one or more updated locations of the one or more key features to the host system 610 as an updated key-point map 625 at an increased rate of, e.g., 100 frames per second since the updated key-point map 625 includes less data than the full resolution key-frame 615. The host system 610 may then process the updated key-point map 625 having a reduced amount of data in comparison with the full resolution key-frame 615, which provides saving in power dissipated at the host system 610 while a computational latency at the host system 610 is also decreased. In this manner, the sensor system 605 and the host system 610 form the host-sensor closed loop system 600 with predictive sparse capture. The host-sensor closed loop system 600 provides power savings at both the sensor system 605 and the host system 610 with an increased communication rate between the sensor system 605 and the host system 610.

In the following, example techniques are provided which can 1) reduce the computing and memory power of sensor system 605; 2) improve privacy and security of image data generated by sensor system 605; and 3) customize the machine learning system (e.g., CNN 360) at sensor system 605.

Memory Power Reduction

In the following, example techniques are provided to improve the power and/or footprint of various memory systems of sensor system 605. The memory systems can include, for example, an image frame buffer to store the digital pixel values of an image captured by the photodetector layer 305 and to be processed by ADC layer 315, feature extraction layer 320, and CNN layer 325. The memory systems can also include, for example, an array of memristors to implement neural network 500.

Figure 7A:
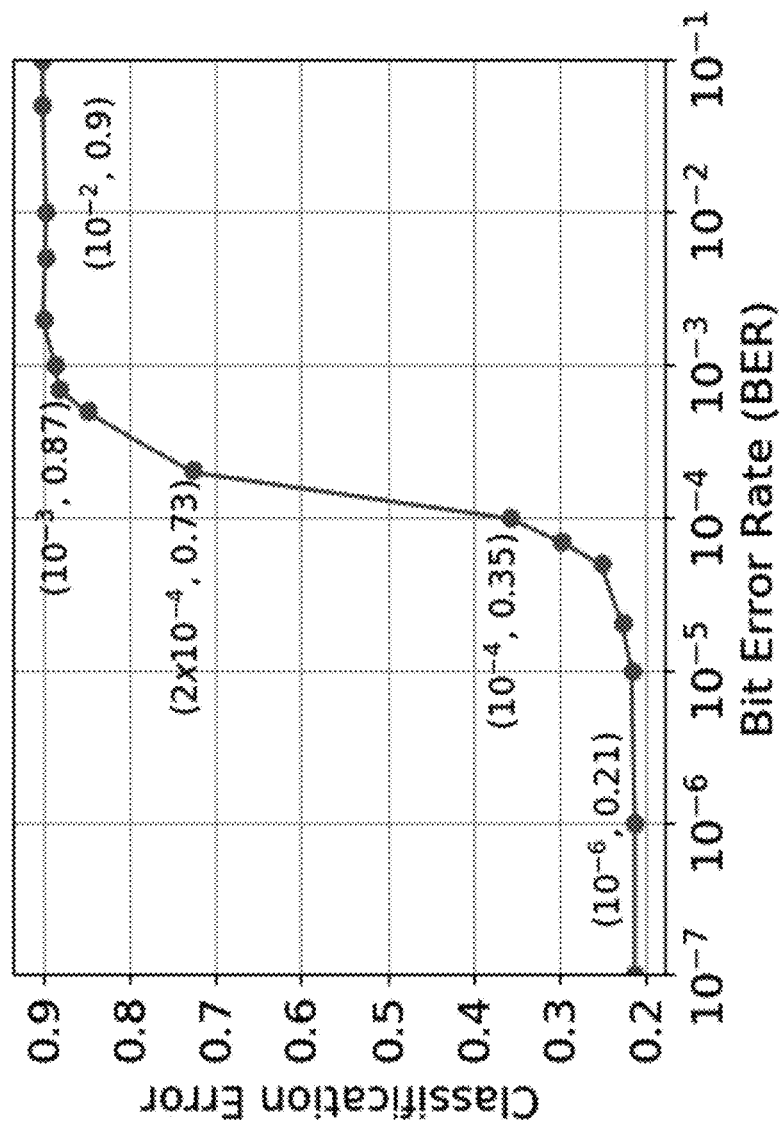
FIG. 7A, FIG. 7B, FIG. 7C, FIG. 7D, FIG. 7E, FIG. 7F, and FIG. 7G illustrate example components of a heterogeneous memory system that can be part of the sensor system of FIG. 6, in accordance with one or more examples of the present disclosure.

FIG. 7A includes a graph 700 that illustrates a relationship between memory bit error rate and the classification error by a machine learning (ML) model, such as CNN 326 of FIG. 3B and neural network 500 of FIG. 5. The bit error rate can be in part of the memory system that stores the digital pixel values of an image, the weights, the intermediate outputs of each neural network layer, etc. As shown in FIG. 7A, the classification error experiences a negligible drop when the bit error rate is below $10^{-5}$, but is already rapidly approaching an apparent limit at and below $10^{-4}$. For example, the classification error is below 0.35 when the bit error rate is below $10^{-4}$, but with a bit error rate of $2 \times 10^{-4}$, the classification error doubles. From FIG. 7A, it can be seen that the machine learning model can have certain tolerance for bit errors. The tolerance for bit errors can be larger for the bit errors at the lower-order bits, also referred to as the least significant bits or "LSBs," than the bit errors at the higher-order bits, also referred to as the most significant bits or "MSBs".

The bit error rate of memory can be determined by power and area of the memory cells. Due to the tolerance for bit errors by the machine learning model, the power and area of the memory cells can be reduced while the bit error rate remains below a threshold (e.g., 10-4) for a target classification error (e.g., 0.35).

Figure 7B:
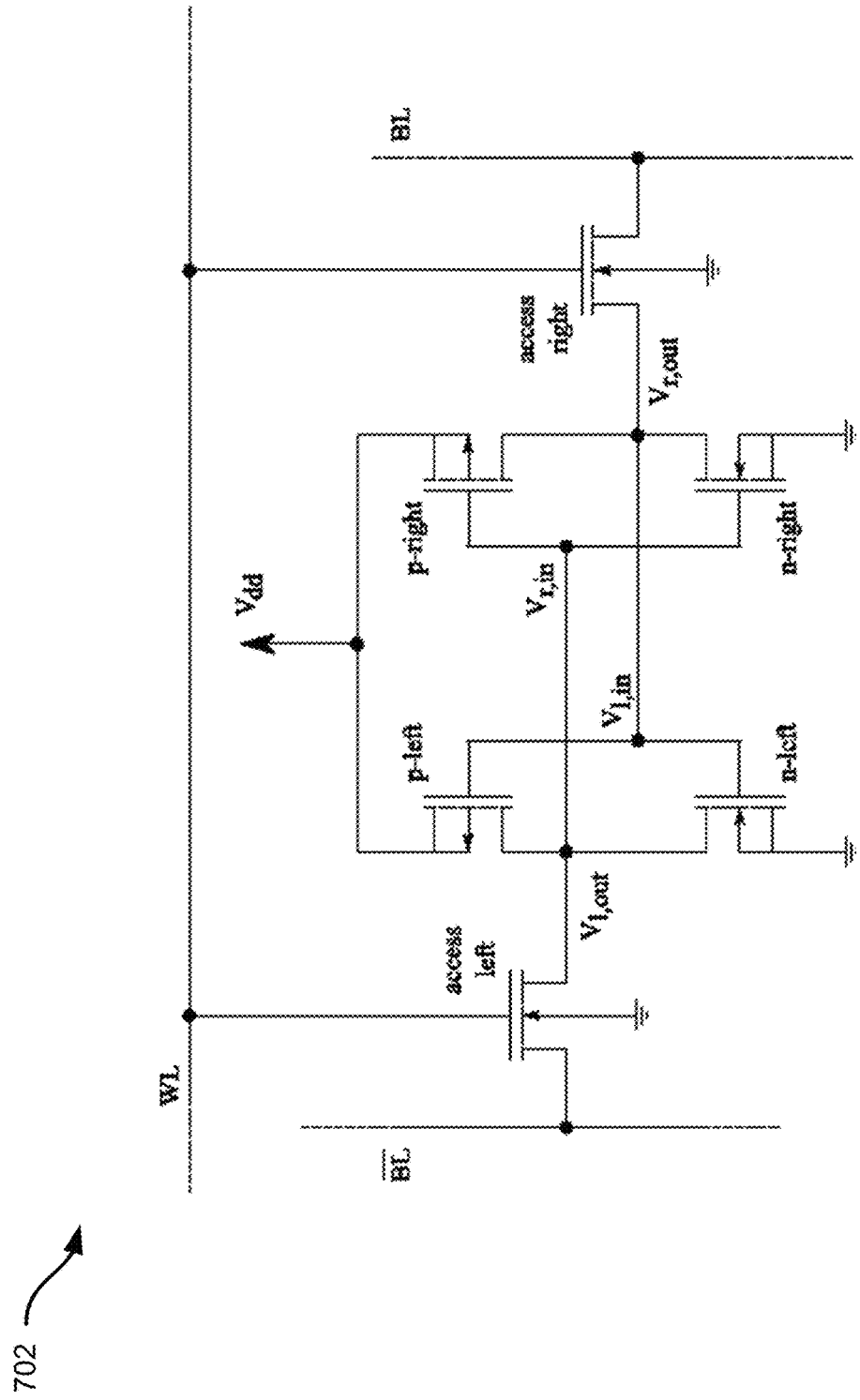

FIG. 7B illustrates an example of a static random-access memory (SRAM) cell 702. Typically SRAM cells have a bit error rate of a bit error rate between 10-8 and 10-7. Referring back to FIG. 7A, there is room for further increase in the bit error rate of the SRAM cells (e.g., up to 10-4) before the classification error experiences a significant increase.

Various techniques can be employed to configure SRAM cell 702 of FIG. 7B to reduce the power consumption and area of SRAM cell 702, which can increase the bit error rate. For example, the read and write voltages on the write lines (WL) and the bit lines (BL) of the SRAM cell can be reduced to reduce power consumption but at the expense of increased bit error rate. The voltage supply (Vdd) can also be reduced.

Specifically, reducing the read/write voltages can reduce the read/write margin, which makes it likely that a write error or a read error can occur. A write error can occur when, for example, a logical one is stored into the memory as a logical zero or vice versa. A read error can occur when, for example, a logical one is stored in the memory but read as a logical zero, or vice versa. Due to the increased likelihood of the read/write error, the bit error rate can increase, while the power consumption can be reduced. The read/write voltages can be reduced until the bit error rate falls below the threshold.

As another example, the transistor size of SRAM cell 702 can also be reduced to reduce the area of SRAM cell 702. For example, typically the pull-up transistors (e.g., p-left, p-right) are sized smaller than the pull-down transistors (e.g., n-left, n-right), while the access transistors (e.g., access-left, access-right) are sized in between the pull-down and pull-up transistors to increase the difference in the voltage levels between logical zero and logical one, which can reduce the likelihood of write error and read error. All the transistors in the SRAM cell can be reduced (e.g., to a minimum size defined by the process technology) to reduce the footprint of the SRAM cell, but such arrangements can reduce the difference in the voltage levels between logical zero and logical one, which can increase bit error rate. The size of the transistors can be reduced until the bit error rate falls below the threshold. In some examples, the transistor size and read/write voltages can both be reduced to achieve a particular bit error rate. In addition, variations in device sizing can affect fixed-pattern noise ("FPN") across devices. However, FPN across different devices, despite variation in sizing, can be reduced through the use of ML training using a particular device's statistics.

Figure 7C:
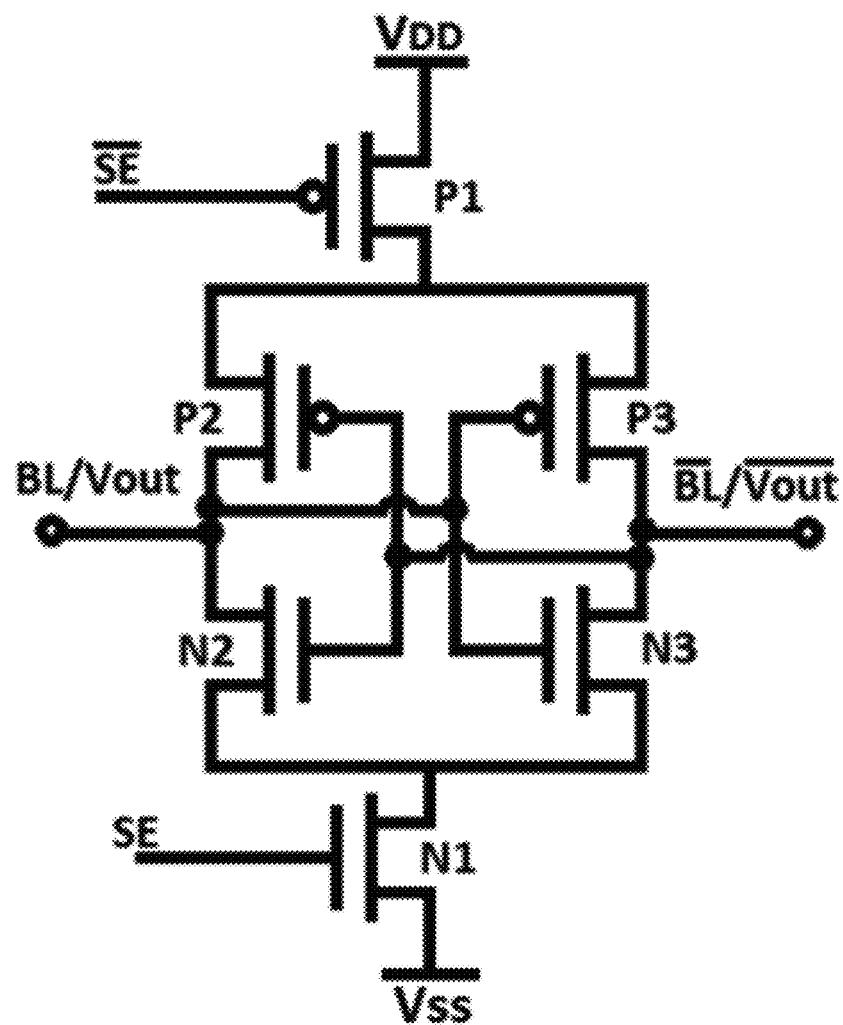

A memory system typically includes a sense amplifier to amplify the read voltages on the bit line pair (BL and (BL)) of the SRAM cells. The sense amplifier can amplify the read voltages to a higher voltage level corresponding to a normal logic level, which can improve the read margin and reduce the likelihood of bit error. But the sense amplifier can also contribute to the bit error if its output mismatches with the content stored in the SRAM cell. FIG. 7C illustrates an example of a sense amplifier 704. The bit error of sense amplifier 704 can be increased due to, for example, reduced transistor sizes of the cross-coupled inverter pairs N2, N3, P2, and P3, which can increase transistor mismatches as well as an offset voltage, reduced current supplied by transistors N1 and P1 to the inverter pairs, reduced supply voltage Vdd, etc. Due to the increased offset voltage and/or reduced current, it becomes more likely that error occurs at the output of sense amplifier 704, which increases the bit error rate of the overall memory system.

Figure 7D:
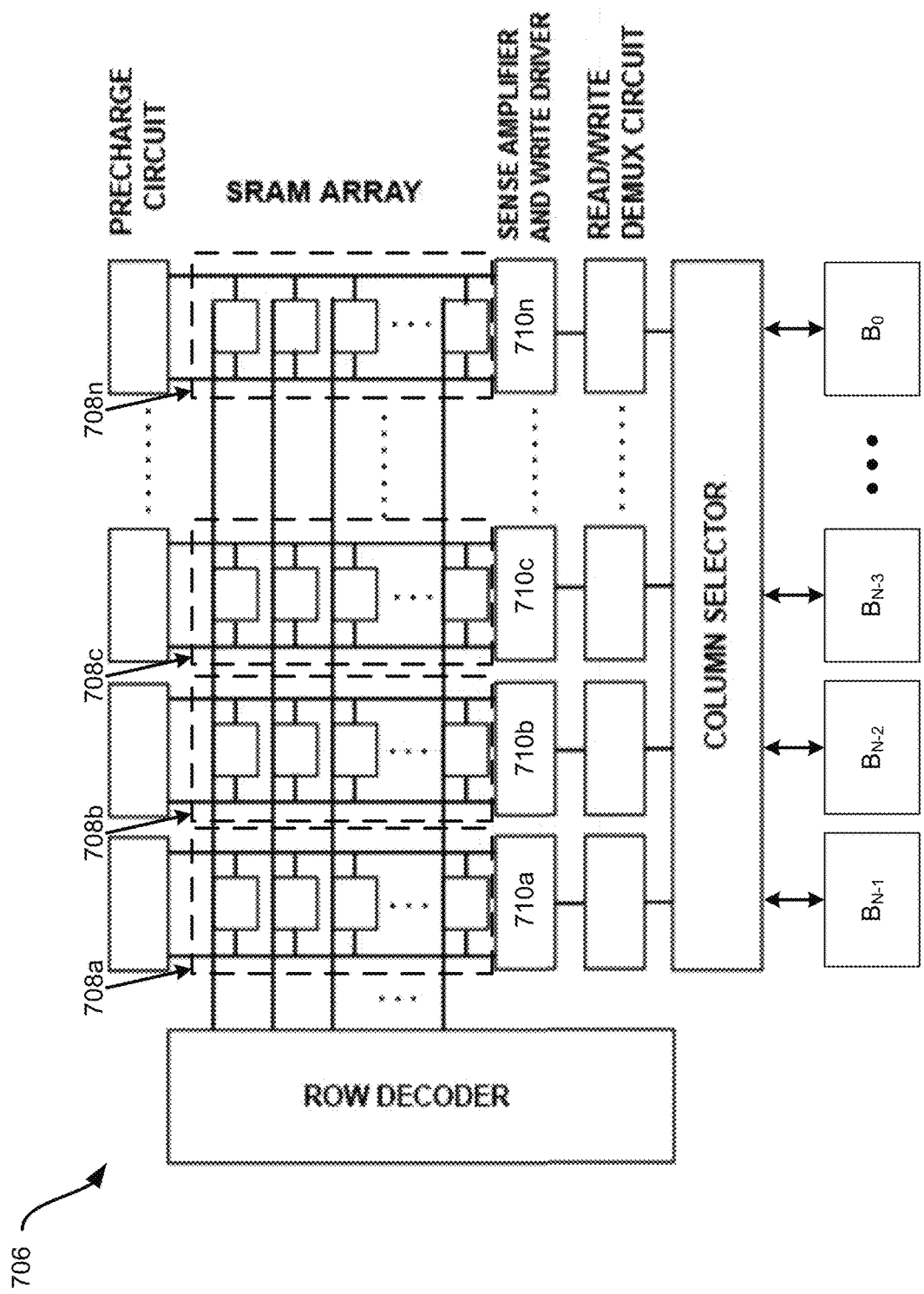

FIG. 7D illustrates an example of a heterogeneous memory system 706 that can provide reduce area footprint/ power consumption while maintaining the bit error rate to be below a certain error threshold. As shown in FIG. 7D, heterogeneous memory system 706 can include a SRAM array comprising SRAM cells organized in rows and columns. Each SRAM cell can include, for example, SRAM cell 702 of FIG. 7B. Each column of SRAM cells can be coupled with a sense amplifier and a write driver. For example, SRAM cell column 708a can be coupled with a sense amplifier and write driver 710a, SRAM cell column 708b can be coupled with a sense amplifier and write driver 710b, SRAM cell column 708c can be coupled with a sense amplifier and write driver 710c, while SRAM cell column 708n can be coupled with a sense amplifier and write driver 710n. Each SRAM cell row can store a data value (e.g., a digital pixel value, an intermediate output value of a neural network layer, etc.). SRAM cell columns 708a and 708b can store higher-order bits (MSBs) of the data value, whereas SRAM cell columns 708c . . . 708n can store lower-order bits (LSBs) of the data value. For example, for a N-bit data value, SRAM cell columns 708a and 708b can store, respective, BN-1 and BN-2 bits of the data value, whereas SRAM cell columns 708c . . . 708n can store BN-3 . . . B0 bits of the data value. As such, heterogeneous memory system 706 can include a first memory comprising SRAM cell columns 708a and 708b, and the associated sense amplifier and write drivers 710a and 710b for higher-order bits, and a second memory comprising SRAM cell columns 708c . . . 708n and the associated sense amplifier and write drivers 710c . . . 710n for lower-order bits.

In heterogeneous memory system 706, SRAM cell columns that store higher-order bits (e.g., SRAM cell columns 708a and 708b) and SRAM cell columns that store lower-order bits (e.g., SRAM cell columns 708c . . . 708n) can be configured to have different bit error rates. For example, SRAM cell columns 708a and 708b can have a lower bit error rate than SRAM cell columns 708c . . . 708n. In some examples, the SRAM cells in SRAM cell columns 708a and 708b can have increased read/write signal levels than the SRAM cells in SRAM cell columns 708c . . . 708n. In some examples, the SRAM cells in SRAM cell columns 708a and 708b can have larger transistor sizes than the SRAM cells in SRAM cell columns 708c . . . 708n.

In addition, sense amplifiers 710a and 710b for SRAM cell columns 708a and 708b can also be configured to have a lower bit error rate (e.g., based on having larger transistors and/or larger current) than sense amplifiers 710c . . . 710n for SRAM cell columns 708c . . . 710n. For example, sense amplifiers 710a and 710b can have larger transistor sizes, uses more current, operate at a higher supply voltage Vdd, etc., than sense amplifiers 710c . . . 710n. The target bit error rates of higher-order bit SRAM cell columns and lower-order bit SRAM cell columns, which can determine the read/write signal levels and transistors for the SRAM cells in the respective SRAM cell columns, can be determined based on a target ML classification error caused by the bit errors at heterogeneous memory system 706.

With such arrangements, the power and/or area of the memory system can be reduced at the expense of increasing the bit error rate of some of the SRAM cells and sense amplifiers. But given that those SRAM cells/sense amplifiers output the LSBs, their contribution to the overall classification error can be limited, which allows the classification error to remain low.

Figure 7E:
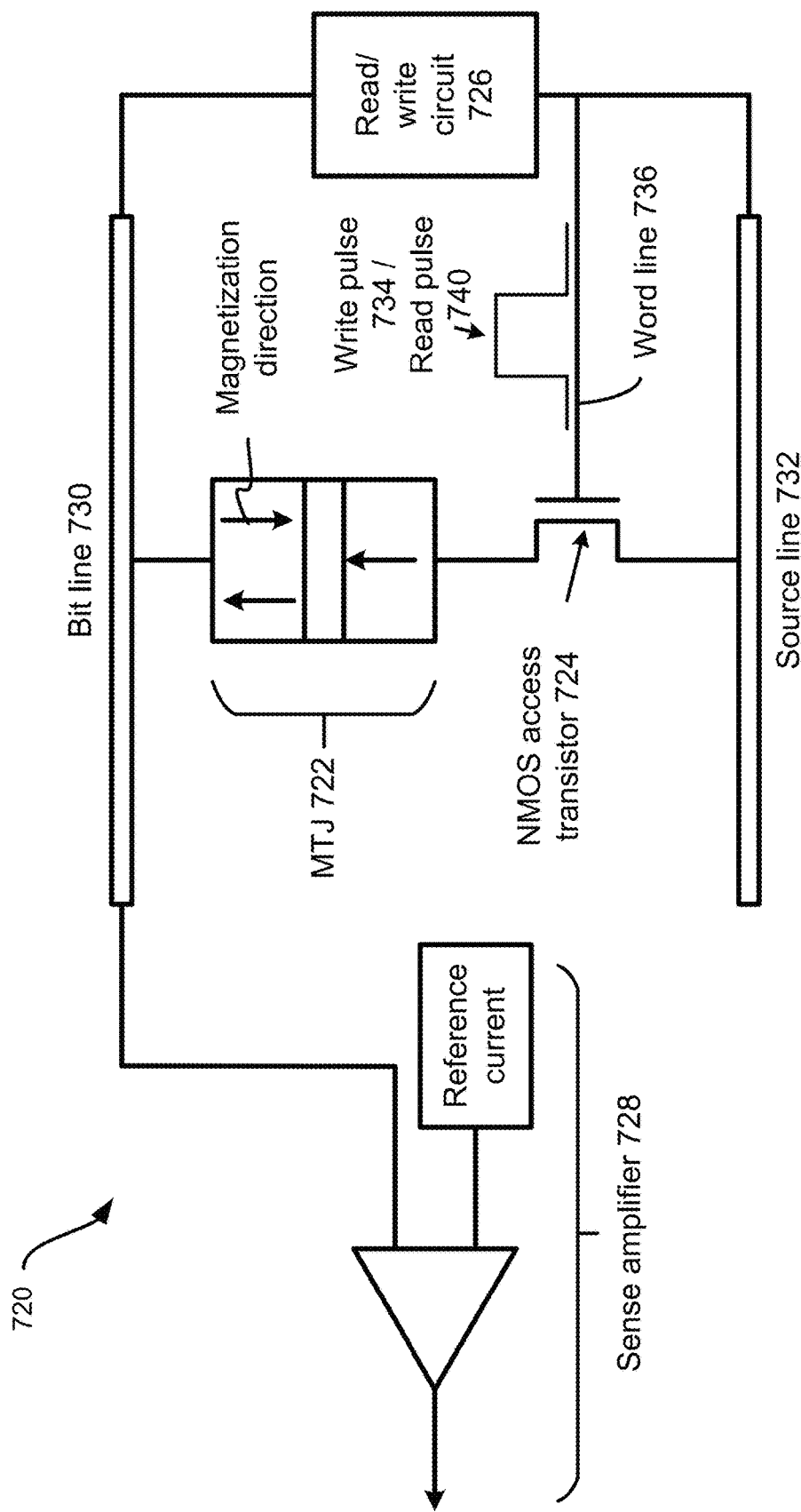

In some examples, a heterogeneous memory system can be implemented using magnetoresistive random access memory (MRAM) devices. FIG. 7E illustrates an example of a MRAM memory 720. As shown in FIG. 7E, MRAM memory 720 can include a magnetic tunnel junction (MTJ) 722 which contains two ferromagnetic layers and one tunnel barrier layer. One of the ferromagnetic layer (reference layer) has fixed magnetic direction while the other one (free layer) can change its magnetic direction by an external electromagnetic field or a spin-transfer torque. When the two layers have the same magnetic direction, the MTJ resistance can be low, which can indicate a logical zero state. When the two layers have different magnetic directions, the MTJ resistance can be high, which can indicate a logical one state. In addition, memory 720 further includes an NMOS access transistor 724, a read/write circuit 726 and a sense amplifier 728. MTJ 722 and NMOS access transistor 724 are coupled across a bit line 730 and a source line 732.

To perform a write operation to change the logical state (which represents the stored information) of MTJ 722, a write current that exceeds a threshold current can flow through MTJ 722. The write current through MTJ 722 can be generated by read/write circuit 726 by applying a write voltage across MTJ 722 (between bit line 730 and source line 732), and turning on NMOS access transistor 724 by applying a write pulse 734 on a word line 736. The amplitude of the write current can be determined based on a duration of write pulse 734 as well as the material of the MTJ.

In addition, to perform a read operation to access the logical state of MTJ 722, read/write circuit 726 can apply a negative voltage, across bit line 730 and source line 732, while enabling NMOS access transistor 724 by applying a read pulse 740 on word line 736, to cause a read current to pass through MTJ 722. Sense amplifier 728 can compare the current with a reference current to determine the logical state of MTJ 722. The read current can be low when the MTJ resistance is high which can indicate a logical one state, whereas the read current can be high when the MTJ resistance is low which can indicate a logical zero state. The amplitude of the read current, typically is small to reduce the likelihood of read disturbance, in which the logical state of MTJ 722 accidentally change as a result of the read current.

Bit error can occur during the write operation if, for example, the logical state in MTJ 722 does not switch as a result of the write pulse during a write operation. Moreover, bit error can also occur during the read operation if it becomes impossible to distinguish, based on the read current, between the two logical states of the MTJ, and/or if a read disturbance occurs during the read operation. The bit error in both the read operation and in the write operation can be a function of the read/write current, as well as the duration of the read/write pulses.

Figure 7F:
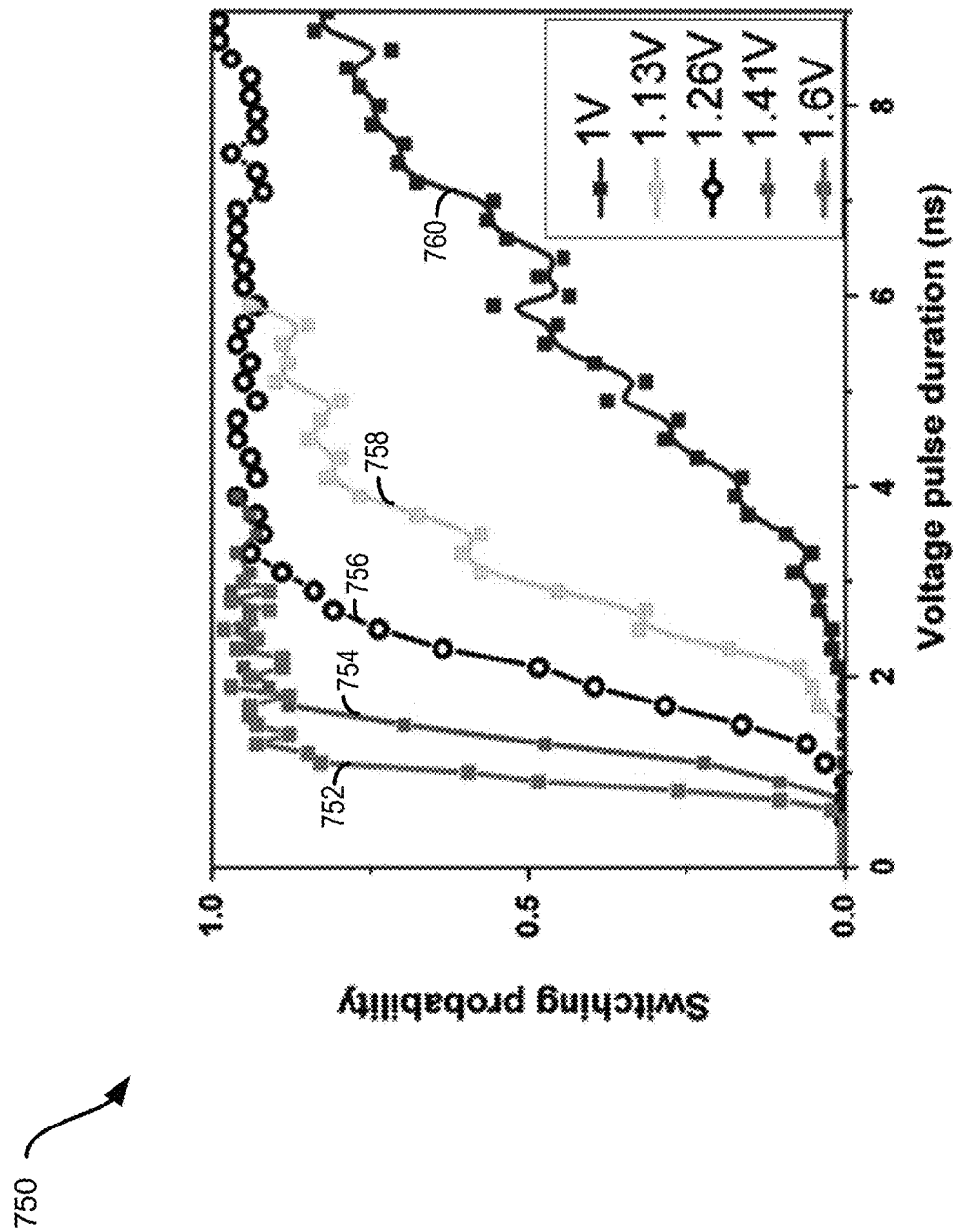

FIG. 7F illustrates a chart 750 that illustrates the switching probability for different write pulse durations of different voltage levels applied on word line 736. Chart 750 includes a graph 752 for a 1.6 V write pulse, a graph 754 for a 1.41 V write pulse, a graph 756 for a 1.26 V write pulse, a graph 758 for a 1.13 V write pulse, and a graph 760 for a 1 V write pulse. As shown in chart 750, with a 1.6 V write pulse, switching probability can be close to 0.9 with a voltage pulse duration exceeding 1 ns. With a 1.41 V write pulse, switching probability can be close to 0.9 with a voltage pulse duration exceeding 1.5 ns. With a 1.26 V write pulse, switching probability can be close to 0.9 with a voltage pulse duration exceeding 3.5 ns. With a 1.13 V write pulse, switching probability can be close to 0.9 with a voltage pulse duration exceeding 6 ns. With a 1 V write pulse, switching probability is about 0.75 with a voltage pulse duration of 9 ns.

Figure 7G:
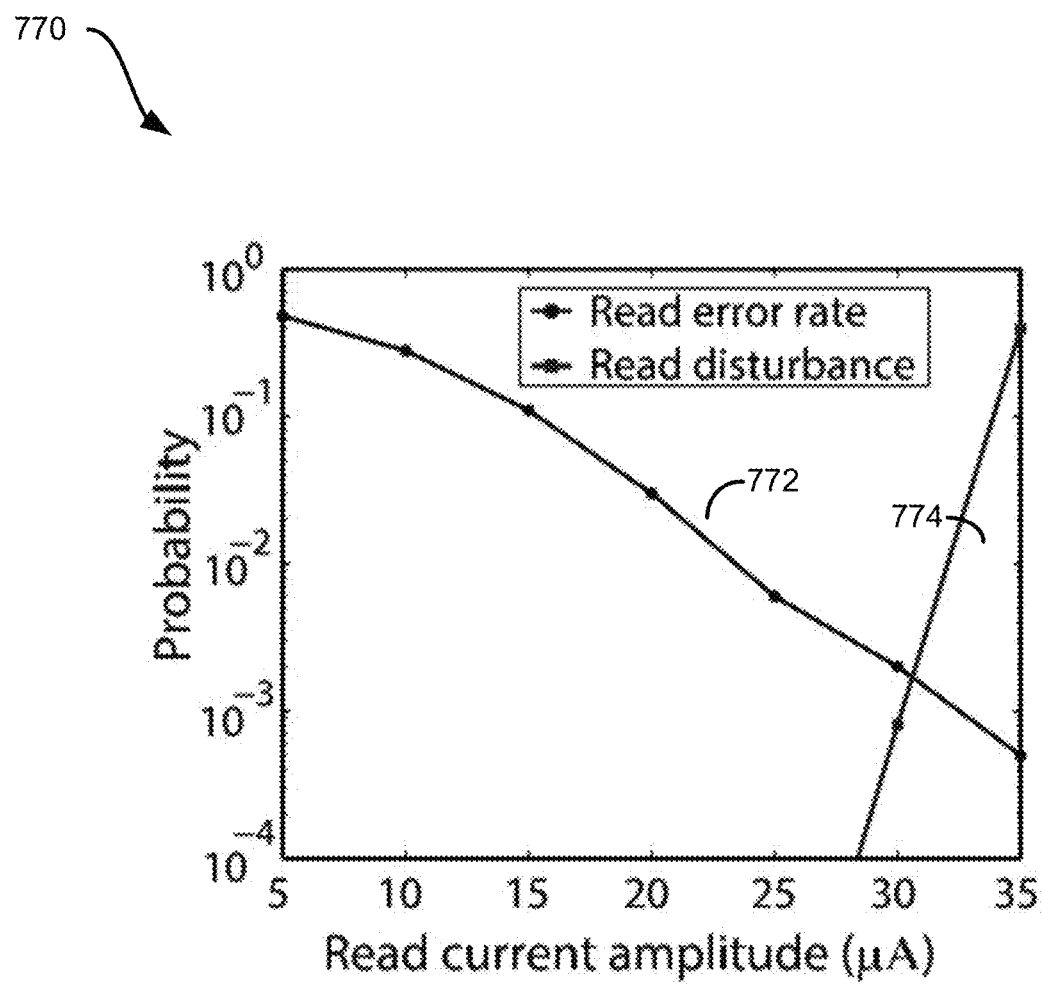

FIG. 7G illustrates a chart 770 that illustrates the relationship between read current and read error rate as well as probability of read disturbance. Chart 770 includes a graph 772 that illustrates the relationship between read current and read error rate, and a graph 774 that illustrates the relationship between read current and probability of read disturbance. As shown in graph 772, the read error rate reduces as the read current increases, but when read current exceeds about 28 uA, the probability of read disturbance increases significantly.

MRAM memory 720 (as well as RRAM and memristors) can be configured to reduce power consumption, at the expense of increased write bit error rate, based on reducing the write current and/or reducing the duration of the write pulse during the write operation. The write current can be reduced by, for example, reducing the voltage level of bit line 730 and/or the voltage level of write pulse 734. The duration of write pulse 734 can also be reduced. Moreover, during read operations MRAM memory 720 can be operated with reduced read current and/or reduced duration of the read pulse to reduce power consumption, also at the expense of increased read bit error rate. The read current can also be reduced by, for example, reducing the voltage level of bit line 730 and/or the voltage level of read pulse 740. In addition, the reference current in sense amplifier 728 can also be reduced to match the reduced read current, which can further reduce the power consumption by MRAM memory 720.

The aforementioned bit error rate configurations can be applied to implement a heterogeneous memory system including MRAM devices. For example, a first memory comprising MRAM devices configured to store higher-order bits can be written using a larger write current and/or within a longer duration to reduce write bit error rate, whereas a second memory comprising MRAM devices configured to store lower-order bits can be written using a smaller write current and/or within a shorter duration to save power but at the expense of increased bit error rate. Moreover, the first memory can be read using a larger read current (but lower than a level that increases the read disturbance rate) and/or within a longer duration to reduce the read bit error rate, whereas the second memory can be read using a smaller read current and within a shorter duration. The write/read current can be configured based on, for example, a voltage of the bit line, a voltage of the read/write pulse, etc.

System Environment

Figure 8:
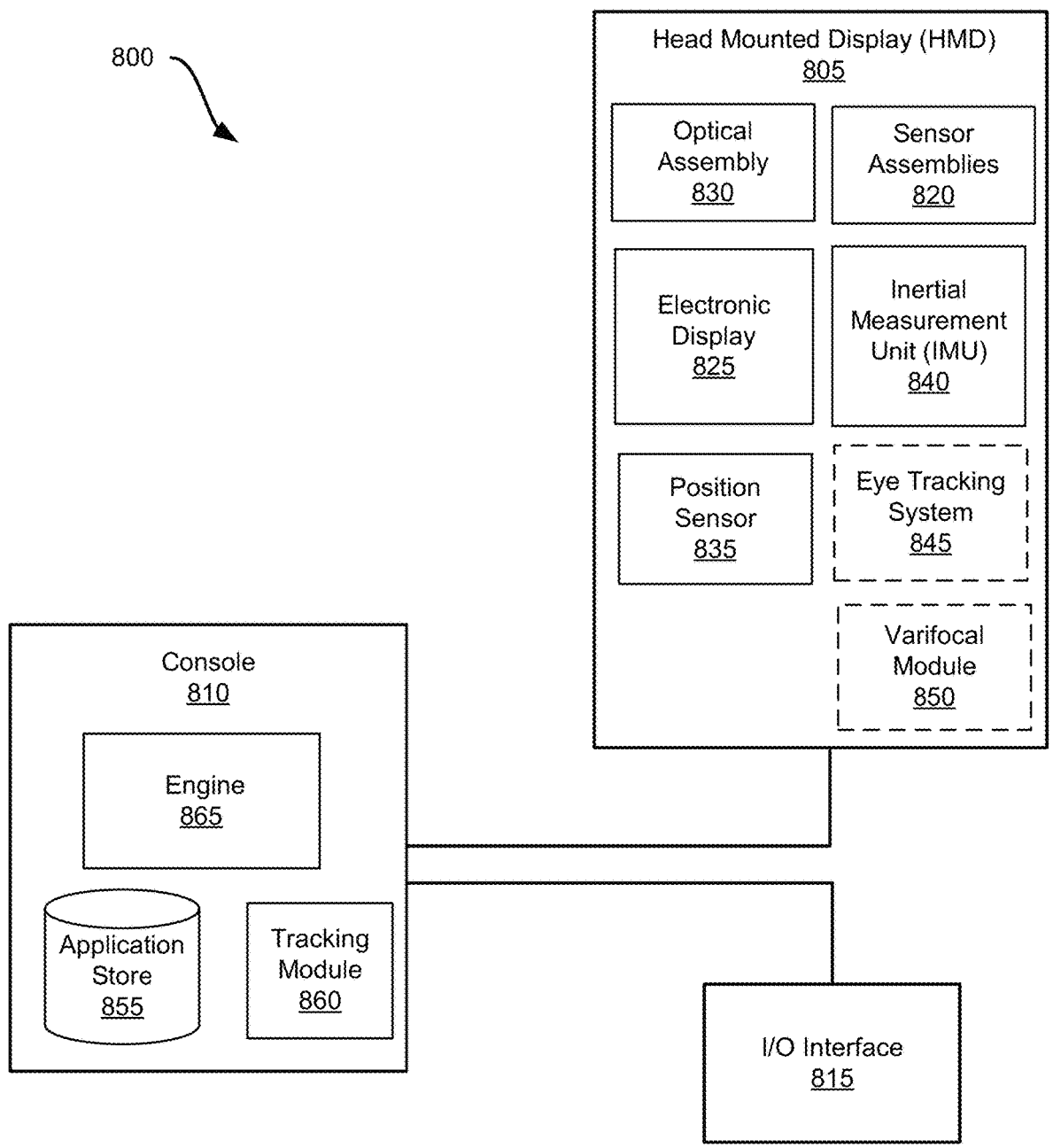
FIG. 8 is a block diagram of a HMD system in which a console operates, in accordance with one or more examples of the present disclosure.

FIG. 8 is a block diagram of one embodiment of a HMD system 800 in which a console 810 operates. The HMD system 800 may operate in an artificial reality system. The HMD system 800 shown by FIG. 8 comprises a HMD 805 and an input/output (I/O) interface 815 that is coupled to the console 810. While FIG. 8 shows an example HMD system 800 including one HMD 805 and an I/O interface 815, in other examples any number of these components may be included in the HMD system 800. For example, there may be multiple HMDs 805 each having an associated I/O interface 815, with each HMD 805 and I/O interface 815 communicating with the console 810. In alternative configurations, different and/or additional components may be included in the HMD system 800. Additionally, functionality described in conjunction with one or more of the components shown in FIG. 8 may be distributed among the components in a different manner than described in conjunction with FIG. 8 in some examples. For example, some or all of the functionality of the console 810 is provided by the HMD 805.

The HMD 805 is a head-mounted display that presents content to a user comprising virtual and/or augmented views of a physical, real-world environment with computer-generated elements (e.g., two-dimensional (2D) or three-dimensional (3D) images, 2D or 3D video, sound, etc.). In some examples, the presented content includes audio that is presented via an external device (e.g., speakers and/or headphones) that receives audio information from the HMD 805, the console 810, or both, and presents audio data based on the audio information. The HMD 805 may comprise one or more rigid bodies, which may be rigidly or non-rigidly coupled together. A rigid coupling between rigid bodies causes the coupled rigid bodies to act as a single rigid entity. In contrast, a non-rigid coupling between rigid bodies allows the rigid bodies to move relative to each other. An example of the HMD 805 may be the HMD 100 described above in conjunction with FIG. 1A.

The HMD 805 includes one or more sensor assemblies 820, an electronic display 825, an optical assembly 830, one or more position sensors 835, an IMU 840, an optional eye tracking system 845, and an optional varifocal module 850. Some examples of the HMD 805 have different components than those described in conjunction with FIG. 8. Additionally, the functionality provided by various components described in conjunction with FIG. 8 may be differently distributed among the components of the HMD 805 in other examples.

Each sensor assembly 820 may comprise a plurality of stacked sensor layers. A first sensor layer located on top of the plurality of stacked sensor layers may include an array of pixels configured to capture one or more images of at least a portion of light reflected from one or more objects in a local area surrounding some or all of the HMD 805. At least one other sensor layer of the plurality of stacked sensor layers located beneath the first (top) sensor layer may be configured to process data related to the captured one or more images. The HMD 805 or the console 810 may dynamically activate a first subset of the sensor assemblies 820 and deactivate a second subset of the sensor assemblies 820 based on, e.g., an application running on the HMD 805. Thus, at each time instant, only a portion of the sensor assemblies 820 would be activated. In some examples, information about one or more tracked features of one or more moving objects may be passed from one sensor assembly 820 to another sensor assembly 820, so the other sensor assembly 820 may continue to track the one or more features of the one or more moving objects.

In some examples, each sensor assembly 820 may be coupled to a host, i.e., a processor (controller) of the HMD 805 or the console 810. The sensor assembly 820 may be configured to send first data of a first resolution to the host using a first frame rate, the first data being associated with an image captured by the sensor assembly 820 at a first time instant. The host may be configured to send, using the first frame rate, information about one or more features obtained based on the first data received from the sensor assembly 820. The sensor assembly 820 may be further configured to send second data of a second resolution lower than the first resolution to the host using a second frame rate higher than the first frame rate, the second data being associated with another image captured by the sensor assembly at a second time instant.

Each sensor assembly 820 may include an interface connection between each pixel in the array of the top sensor layer and logic of at least one sensor layer of the one or more sensor layers located beneath the top sensor layer. At least one of the one or more sensor layers located beneath the top sensor layer of the sensor assembly 820 may include logic configured to extract one or more features from the captured one or more images. At least one of the one or more sensor layers located beneath the top sensor layer of the sensor assembly 820 may further include a CNN based on an array of memristors for storage of trained network weights.

At least one sensor assembly 820 may capture data describing depth information of the local area. The at least one sensor assembly 820 can compute the depth information using the data (e.g., based on a captured portion of a structured light pattern). Alternatively, the at least one sensor assembly 820 can send this information to another device such as the console 810 that can determine the depth information using the data from the sensor assembly 820.

Each of the sensor assemblies 820 may be an embodiment of the sensor device 130 in FIG. 1A, the sensor assembly 200 in FIG. 2, the sensor assembly 300 in FIG. 3, and/or the sensor system 605 in FIG. 6.

The electronic display 825 displays two-dimensional or three-dimensional images to the user in accordance with data received from the console 810. In various examples, the electronic display 825 comprises a single electronic display or multiple electronic displays (e.g., a display for each eye of a user). Examples of the electronic display 825 include: a LCD, an OLED display, an ILED display, an AMOLED display, a TOLED display, some other display, or some combination thereof. The electronic display 825 may be an embodiment of the electronic display 155 in FIG. 1B.

The optical assembly 830 magnifies image light received from the electronic display 825, corrects optical errors associated with the image light, and presents the corrected image light to a user of the HMD 805. The optical assembly 830 includes a plurality of optical elements. Example optical elements included in the optical assembly 830 include: an aperture, a Fresnel lens, a convex lens, a concave lens, a filter, a reflecting surface, or any other suitable optical element that affects image light. Moreover, the optical assembly 830 may include combinations of different optical elements. In some examples, one or more of the optical elements in the optical assembly 830 may have one or more coatings, such as partially reflective or anti-reflective coatings.

Magnification and focusing of the image light by the optical assembly 830 allows the electronic display 825 to be physically smaller, weigh less and consume less power than larger displays. Additionally, magnification may increase the field-of-view of the content presented by the electronic display 825. For example, the field-of-view of the displayed content is such that the displayed content is presented using almost all (e.g., approximately 110 degrees diagonal), and in some cases all, of the field-of-view. Additionally in some examples, the amount of magnification may be adjusted by adding or removing optical elements.

In some examples, the optical assembly 830 may be designed to correct one or more types of optical error. Examples of optical error include barrel or pincushion distortions, longitudinal chromatic aberrations, or transverse chromatic aberrations. Other types of optical errors may further include spherical aberrations, chromatic aberrations or errors due to the lens field curvature, astigmatisms, or any other type of optical error. In some examples, content provided to the electronic display 825 for display is pre-distorted, and the optical assembly 830 corrects the distortion when it receives image light from the electronic display 825 generated based on the content. In some examples, the optical assembly 830 is configured to direct image light emitted from the electronic display 825 to an eye box of the HMD 805 corresponding to a location of a user's eye. The image light may include depth information for the local area determined by at least one of the plurality of sensor assemblies 820 based in part on the processed data. The optical assembly 830 may be an embodiment of the optical assembly 160 in FIG. 1B.

The IMU 840 is an electronic device that generates data indicating a position of the HMD 805 based on measurement signals received from one or more of the position sensors 835 and from depth information received from the at least one sensor assembly 820. A position sensor 835 generates one or more measurement signals in response to motion of the HMD 805. Examples of position sensors 835 include: one or more accelerometers, one or more gyroscopes, one or more magnetometers, another suitable type of sensor that detects motion, a type of sensor used for error correction of the IMU 840, or some combination thereof. The position sensors 835 may be located external to the IMU 840, internal to the IMU 840, or some combination thereof.

Based on the one or more measurement signals from one or more position sensors 835, the IMU 840 generates data indicating an estimated current position of the HMD 805 relative to an initial position of the HMD 805. For example, the position sensors 835 include multiple accelerometers to measure translational motion (forward/back, up/down, left/right) and multiple gyroscopes to measure rotational motion (e.g., pitch, yaw, roll). In some examples, the position sensors 835 may represent the position sensors 125 of FIG. 1A. In some examples, the IMU 840 rapidly samples the measurement signals and calculates the estimated current position of the HMD 805 from the sampled data. For example, the IMU 840 integrates the measurement signals received from the accelerometers over time to estimate a velocity vector and integrates the velocity vector over time to determine an estimated current position of a reference point on the HMD 805. Alternatively, the IMU 840 provides the sampled measurement signals to the console 810, which interprets the data to reduce error. The reference point is a point that may be used to describe the position of the HMD 805. The reference point may generally be defined as a point in space or a position related to the HMD's 805 orientation and position.

The IMU 840 receives one or more parameters from the console 810. The one or more parameters are used to maintain tracking of the HMD 805. Based on a received parameter, the IMU 840 may adjust one or more IMU parameters (e.g., sample rate). In some examples, certain parameters cause the IMU 840 to update an initial position of the reference point so it corresponds to a next position of the reference point. Updating the initial position of the reference point as the next calibrated position of the reference point helps reduce accumulated error associated with the current position estimated the IMU 840. The accumulated error, also referred to as drift error, causes the estimated position of the reference point to "drift" away from the actual position of the reference point over time. In some examples of the HMD 805, the IMU 840 may be a dedicated hardware component. In other examples, the IMU 840 may be a software component implemented in one or more processors. In some examples, the IMU 840 may represent the IMU 130 of FIG. 1A.

In some examples, the eye tracking system 845 is integrated into the HMD 805. The eye tracking system 845 determines eye tracking information associated with an eye of a user wearing the HMD 805. The eye tracking information determined by the eye tracking system 845 may comprise information about an orientation of the user's eye, i.e., information about an angle of an eye-gaze. In some examples, the eye tracking system 845 is integrated into the optical assembly 830. An embodiment of the eye-tracking system 845 may comprise an illumination source and an imaging device (camera).

In some examples, the varifocal module 850 is further integrated into the HMD 805. The varifocal module 850 may be coupled to the eye tracking system 845 to obtain eye tracking information determined by the eye tracking system 845. The varifocal module 850 may be configured to adjust focus of one or more images displayed on the electronic display 825, based on the determined eye tracking information obtained from the eye tracking system 845. In this way, the varifocal module 850 can mitigate vergence-accommodation conflict in relation to image light. The varifocal module 850 can be interfaced (e.g., either mechanically or electrically) with at least one of the electronic display 825, and at least one optical element of the optical assembly 830. Then, the varifocal module 850 may be configured to adjust focus of the one or more images displayed on the electronic display 825 by adjusting position of at least one of the electronic display 825 and the at least one optical element of the optical assembly 830, based on the determined eye tracking information obtained from the eye tracking system 845. By adjusting the position, the varifocal module 850 varies focus of image light output from the electronic display 825 towards the user's eye. The varifocal module 850 may be also configured to adjust resolution of the images displayed on the electronic display 825 by performing foveated rendering of the displayed images, based at least in part on the determined eye tracking information obtained from the eye tracking system 845. In this case, the varifocal module 850 provides appropriate image signals to the electronic display 825. The varifocal module 850 provides image signals with a maximum pixel density for the electronic display 825 only in a foveal region of the user's eye-gaze, while providing image signals with lower pixel densities in other regions of the electronic display 825. In one embodiment, the varifocal module 850 may utilize the depth information obtained by the at least one sensor assembly 820 to, e.g., generate content for presentation on the electronic display 825.

The I/O interface 815 is a device that allows a user to send action requests and receive responses from the console 810. An action request is a request to perform a particular action. For example, an action request may be an instruction to start or end capture of image or video data or an instruction to perform a particular action within an application. The I/O interface 815 may include one or more input devices. Example input devices include: a keyboard, a mouse, a game controller, or any other suitable device for receiving action requests and communicating the action requests to the console 810. An action request received by the I/O interface 815 is communicated to the console 810, which performs an action corresponding to the action request. In some examples, the I/O interface 815 includes an IMU 840 that captures IMU data indicating an estimated position of the I/O interface 815 relative to an initial position of the I/O interface 815. In some examples, the I/O interface 815 may provide haptic feedback to the user in accordance with instructions received from the console 810. For example, haptic feedback is provided when an action request is received, or the console 810 communicates instructions to the I/O interface 815 causing the I/O interface 815 to generate haptic feedback when the console 810 performs an action.

The console 810 provides content to the HMD 805 for processing in accordance with information received from one or more of: the at least one sensor assembly 820, the HMD 805, and the I/O interface 815. In the example shown in FIG. 8, the console 810 includes an application store 855, a tracking module 860, and an engine 865. Some examples of the console 810 have different modules or components than those described in conjunction with FIG. 8. Similarly, the functions further described below may be distributed among components of the console 810 in a different manner than described in conjunction with FIG. 8.

The application store 855 stores one or more applications for execution by the console 810. An application is a group of instructions, that when executed by a processor, generates content for presentation to the user. Content generated by an application may be in response to inputs received from the user via movement of the HMD 805 or the I/O interface 815. Examples of applications include: gaming applications, conferencing applications, video playback applications, or other suitable applications.

The tracking module 860 calibrates the HMD system 800 using one or more calibration parameters and may adjust one or more calibration parameters to reduce error in determination of the position of the HMD 805 or of the I/O interface 815. For example, the tracking module 860 communicates a calibration parameter to the at least one sensor assembly 820 to adjust the focus of the at least one sensor assembly 820 to more accurately determine positions of structured light elements captured by the at least one sensor assembly 820. Calibration performed by the tracking module 860 also accounts for information received from the IMU 840 in the HMD 805 and/or an IMU 840 included in the I/O interface 815. Additionally, if tracking of the HMD 805 is lost (e.g., the at least one sensor assembly 820 loses line of sight of at least a threshold number of structured light elements), the tracking module 860 may re-calibrate some or all of the HMD system 800.

The tracking module 860 tracks movements of the HMD 805 or of the I/O interface 815 using information from the at least one sensor assembly 820, the one or more position sensors 835, the IMU 840 or some combination thereof. For example, the tracking module 850 determines a position of a reference point of the HMD 805 in a mapping of a local area based on information from the HMD 805. The tracking module 860 may also determine positions of the reference point of the HMD 805 or a reference point of the I/O interface 815 using data indicating a position of the HMD 805 from the IMU 840 or using data indicating a position of the I/O interface 815 from an IMU 840 included in the I/O interface 815, respectively. Additionally, in some examples, the tracking module 860 may use portions of data indicating a position or the HMD 805 from the IMU 840 as well as representations of the local area from the at least one sensor assembly 820 to predict a future location of the HMD 805. The tracking module 860 provides the estimated or predicted future position of the HMD 805 or the I/O interface 815 to the engine 855.

The engine 865 generates a 3D mapping of the local area surrounding some or all of the HMD 805 based on information received from the HMD 805. In some examples, the engine 865 determines depth information for the 3D mapping of the local area based on information received from the at least one sensor assembly 820 that is relevant for techniques used in computing depth. The engine 865 may calculate depth information using one or more techniques in computing depth from structured light. In various examples, the engine 865 uses the depth information to, e.g., update a model of the local area, and generate content based in part on the updated model.

The engine 865 also executes applications within the HMD system 800 and receives position information, acceleration information, velocity information, predicted future positions, or some combination thereof, of the HMD 805 from the tracking module 860. Based on the received information, the engine 865 determines content to provide to the HMD 805 for presentation to the user. For example, if the received information indicates that the user has looked to the left, the engine 865 generates content for the HMD 805 that mirrors the user's movement in a virtual environment or in an environment augmenting the local area with additional content. Additionally, the engine 865 performs an action within an application executing on the console 810 in response to an action request received from the I/O interface 815 and provides feedback to the user that the action was performed. The provided feedback may be visual or audible feedback via the HMD 805 or haptic feedback via the I/O interface 815.

In some examples, based on the eye tracking information (e.g., orientation of the user's eye) received from the eye tracking system 845, the engine 865 determines resolution of the content provided to the HMD 805 for presentation to the user on the electronic display 825. The engine 865 provides the content to the HMD 805 having a maximum pixel resolution on the electronic display 825 in a foveal region of the user's gaze, whereas the engine 865 provides a lower pixel resolution in other regions of the electronic display 825, thus achieving less power consumption at the HMD 805 and saving computing cycles of the console 810 without compromising a visual experience of the user. In some examples, the engine 865 can further use the eye tracking information to adjust where objects are displayed on the electronic display 825 to prevent vergence-accommodation conflict.

Additional Configuration Information

The foregoing description of the examples of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the examples of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Examples of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Examples of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the examples is intended to be illustrative, but not limiting, of the scope of the disclosure, which is set forth in the following claims.

That which is claimed is:

1. An apparatus comprising:
a first sensor layer, of a plurality of stacked sensor layers, including an array of pixels; and
one or more semiconductor layers of the plurality of stacked sensor layers located beneath the first sensor layer, the one or more semiconductor layers configured to process pixel data output by the array of pixels, the one or more semiconductor layers comprising:
a first memory to store most significant bits ("MSBs") of data involved in the processing of the pixel data; and
a second memory to store least significant bits ("LSBs") of the data,
wherein the first memory has a lower bit error rate ("BER") than the second memory,
wherein the one or more semiconductor layers further comprise a machine learning (ML) model accelerator to process the pixel data, and wherein the data includes at least one of the pixel data, weights, and intermediate output data of the ML model, and
wherein the bit error rate of the first memory and the bit error rate of the second memory are based on a target classification error rate of processing of the pixel data by the ML model.

2. The apparatus of claim 1, wherein the ML model includes a neural network.

3. The apparatus of claim 2, wherein the neural network is a convolutional neural network.

4. The apparatus of claim 1, wherein each of the first memory and the second memory includes a plurality of static random access memory (SRAM) cells.

5. The apparatus of claim 4, wherein the SRAM cells of the first memory have larger transistor sizes than the SRAM cells of the second memory.

6. The apparatus of claim 5, wherein each SRAM cell includes a pair of pull-up transistors and a pair of pull-down transistors to set a logical state stored in the SRAM cell, and a pair of access transistors to access the logical state stored in the SRAM cell; and
wherein in the SRAM cells of the first memory, a size of the pull-down transistor is larger than a size of the access transistor, and the size of the access transistor is larger than a size of the pull-up transistor.

7. The apparatus of claim 5, wherein each SRAM cell includes a pair of pull-up transistors and a pair of pull-down transistors to set a logical state stored in the SRAM cell, and a pair of access transistors to access the logical state stored in the SRAM cell; and wherein in the SRAM cells of the second memory, a size of the pull-down transistor, a size of the access transistor, and a size of the access transistor are set to be equal.

8. The apparatus of claim 7, wherein in the SRAM cells of the second memory, the size of the pull-down transistors, the size of the pull-up transistors, and the size of the access transistors are set to a minimum size defined by a process technology used to create such transistors.

9. The apparatus of claim 4, wherein the SRAM cells of the first memory have a higher supply voltage than the SRAM cells of the second memory.

10. The apparatus of claim 4, wherein the SRAM cells of the first memory are operated by read and write signals having a first signal level;
wherein the SRAM cells of the second memory are operated by read and write signals having a second signal level; and
wherein the first signal level is higher than the second signal level.

11. The apparatus of claim 4, wherein the first memory further includes first sense amplifiers coupled with the SRAM cells of the first memory;
wherein the second memory further includes second sense amplifiers coupled with the SRAM cells of the second memory; and
wherein the first sense amplifiers operate with a larger current than the second sense amplifiers.

12. The apparatus of claim 11, wherein the first sense amplifiers have larger transistor sizes than the second sense amplifiers.

13. The apparatus of claim 1, wherein each of the first memory and the second memory includes a plurality of magnetoresistive random access memories (MRAM) devices, a plurality of resistive random access memories (RRAM), or memristors.

14. The apparatus of claim 13, wherein the MRAM devices of the first memory are operated with a first write current to perform write operations;
wherein the MRAM devices of the second memory are operated with a second write current to perform write operations; and
wherein the first write current is larger than the second write current.

15. The apparatus of claim 13, wherein the MRAM devices of the first memory are operated with a first write pulse to perform write operations;
wherein the MRAM devices of the second memory are operated with a second write pulse to perform write operations; and
wherein a duration of the first write pulse is longer than the second write pulse.

16. The apparatus of claim 13, wherein the MRAM devices of the first memory are operated with a first read current to perform read operations;
wherein the MRAM devices of the second memory are operated with a second read current to perform read operations; and
wherein the first read current is larger than the second read current.

17. The apparatus of claim 13, wherein the MRAM devices of the first memory are operated with a first read pulse to perform read operations;
wherein the MRAM devices of the second memory are operated with a second read pulse to perform read operations; and
wherein a duration of the first read pulse is longer than the second read pulse.

18. A head-mounted display ("HMD") device comprising:
an image sensor; and an electronic display, the electronic display configured to display images based on data received from a console device; and wherein the image sensor is configured to transmit captured images to the console device, and wherein the image sensor comprises:
  a first sensor layer, of a plurality of stacked sensor layers, including an array of pixels; and
  one or more semiconductor layers of the plurality of stacked sensor layers located beneath the first sensor layer, the one or more semiconductor layers configured to process pixel data output by the array of pixels, the one or more semiconductor layers comprising a first memory to store most significant bits ("MSBs") of data involved in the processing of the pixel data; and a second memory to store least significant bits ("LSBs") of the data, wherein the first memory has a lower bit error rate ("BER") than the second memory, wherein the one or more semiconductor layers further comprise a machine learning (ML) model accelerator configured to process the pixel data, and wherein the data includes at least one of the pixel data, weights, and intermediate output data of the ML model, and wherein the bit error rate of the first memory and the bit error rate of the second memory are based on a target classification error rate of processing of the pixel data by the ML model.

19. The HMD apparatus of claim 18, wherein the ML model includes a neural network.

20. The HMD apparatus of claim 19, wherein the neural network is a convolutional neural network.

* * * * *